US012317705B2

United States Patent
Sun et al.

(10) Patent No.: US 12,317,705 B2
(45) Date of Patent: May 27, 2025

(54) DISPLAY DEVICE

(71) Applicant: SHARP KABUSHIKI KAISHA, Sakai (JP)

(72) Inventors: Yi Sun, Sakai (JP); Masaki Yamanaka, Sakai (JP); Takao Saitoh, Sakai (JP); Yohsuke Kanzaki, Sakai (JP); Masahiko Miwa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 558 days.

(21) Appl. No.: 17/770,797

(22) PCT Filed: Nov. 1, 2019

(86) PCT No.: PCT/JP2019/043136
§ 371 (c)(1),
(2) Date: Apr. 21, 2022

(87) PCT Pub. No.: WO2021/084757
PCT Pub. Date: May 6, 2021

(65) Prior Publication Data
US 2022/0376027 A1    Nov. 24, 2022

(51) Int. Cl.
*H10K 59/131*    (2023.01)
*H10K 59/121*    (2023.01)
*H10K 59/35*    (2023.01)

(52) U.S. Cl.
CPC ....... *H10K 59/131* (2023.02); *H10K 59/1213* (2023.02); *H10K 59/353* (2023.02)

(58) Field of Classification Search
CPC .......... H10K 50/115; H10K 59/00–95; H10K 65/00; H10K 71/00–861; H10K 85/00–791; H10K 2101/00–90; H10K 2102/00–361
See application file for complete search history.

(56) References Cited

U.S. PATENT DOCUMENTS

| 6,974,972 B1 | 12/2005 | Tanaka et al. |
| 2013/0200366 A1* | 8/2013 | Koyama ............ H10D 30/6755 257/43 |
| 2019/0081118 A1* | 3/2019 | Oh ........................ H10K 77/10 |

FOREIGN PATENT DOCUMENTS

JP    2001-189461 A    7/2001

* cited by examiner

*Primary Examiner* — Evren Seven
*Assistant Examiner* — Cole Leon Lindsey
(74) *Attorney, Agent, or Firm* — ScienBiziP, P.C.

(57) ABSTRACT

A display device in accordance with the disclosure includes a substrate, an insular semiconductor layer, a gate insulation film, a plurality of control lines extending in a row direction, a first interlayer insulation film, and a plurality of data signal lines extending in a column direction, all of which are provided in a stated order. The insular semiconductor layer, residing in a display area, is electrically separated from the plurality of control lines and the plurality of data signal lines and overlaps one of the plurality of control lines in a plan view taken normal to the substrate.

13 Claims, 11 Drawing Sheets

DISPLAY DEVICE

TECHNICAL FIELD

The disclosure relates to display devices.

BACKGROUND ART

Various flat panel display devices have been developed. Especially, those display devices which include QLEDs (quantum-dot light-emitting diodes) or OLEDs (organic light-emitting diodes) as electroluminescence elements are attracting attention.

These display devices include, on the back plane thereof, a stack including: a semiconductor layer and a gate insulation film; and one or more sets of conductive layers and interlayer insulation films.

Patent Literature 1 discloses a structure that prevents cracks to restrain a substrate from bending, the stack being formed on a gate insulation film on the substrate.

CITATION LIST

Patent Literature

Patent Literature 1: Japanese Unexamined Patent Application Publication, Tokukai, No. 2001-189461 (Publication Date: Jul. 10, 2001)

SUMMARY

Technical Problem

In forming a conductive layer for providing control lines on the gate insulation film, a support substrate, as well as the gate insulation film among the other components, could bend and hence likely cause unwanted cracks in the gate insulation film.

In view of this issue, it is an object of the disclosure to prevent cracks in the gate insulation film.

Solution to Problem

To address the issue, the disclosure, in one aspect thereof, is directed to a display device including a substrate, a semiconductor layer, a gate insulation film, first wiring, a first interlayer insulation film, and second wiring, all of which are provided in a stated order, the display device having a display area and a frame area around the display area, the display device further including in the display area: a plurality of control lines, which is a part of the first wiring, extending in a row direction; a plurality of data signal lines, which is a part of the second wiring, extending in a column direction that differs from the row direction; a plurality of subpixels, one for each intersection of the plurality of control lines and the plurality of data signal lines; a plurality of light-emitting elements, one for each one of the plurality of subpixels; and an insular semiconductor layer in the semiconductor layer, the insular semiconductor layer being electrically separated from the plurality of control lines and the plurality of data signal lines and being provided overlapping one of the plurality of control lines in a plan view taken normal to the substrate.

Advantageous Effects of Disclosure

A display device in accordance with one aspect of the disclosure can prevent cracks in the gate insulation film.

DESCRIPTION OF EMBODIMENTS

Method of Manufacturing Display Device and Structure Thereof

Throughout the following description, expressions like "component A is in the same layer as component B" indicate that components A and B are formed in a single process or step (film forming step), expressions like "component A underlies/is below component B" indicate that component A is formed in an earlier process or step than component B, and expressions like "component A overlies/is on or above component B" indicate that component A is formed in a later process or step than component B.

Figure 1:
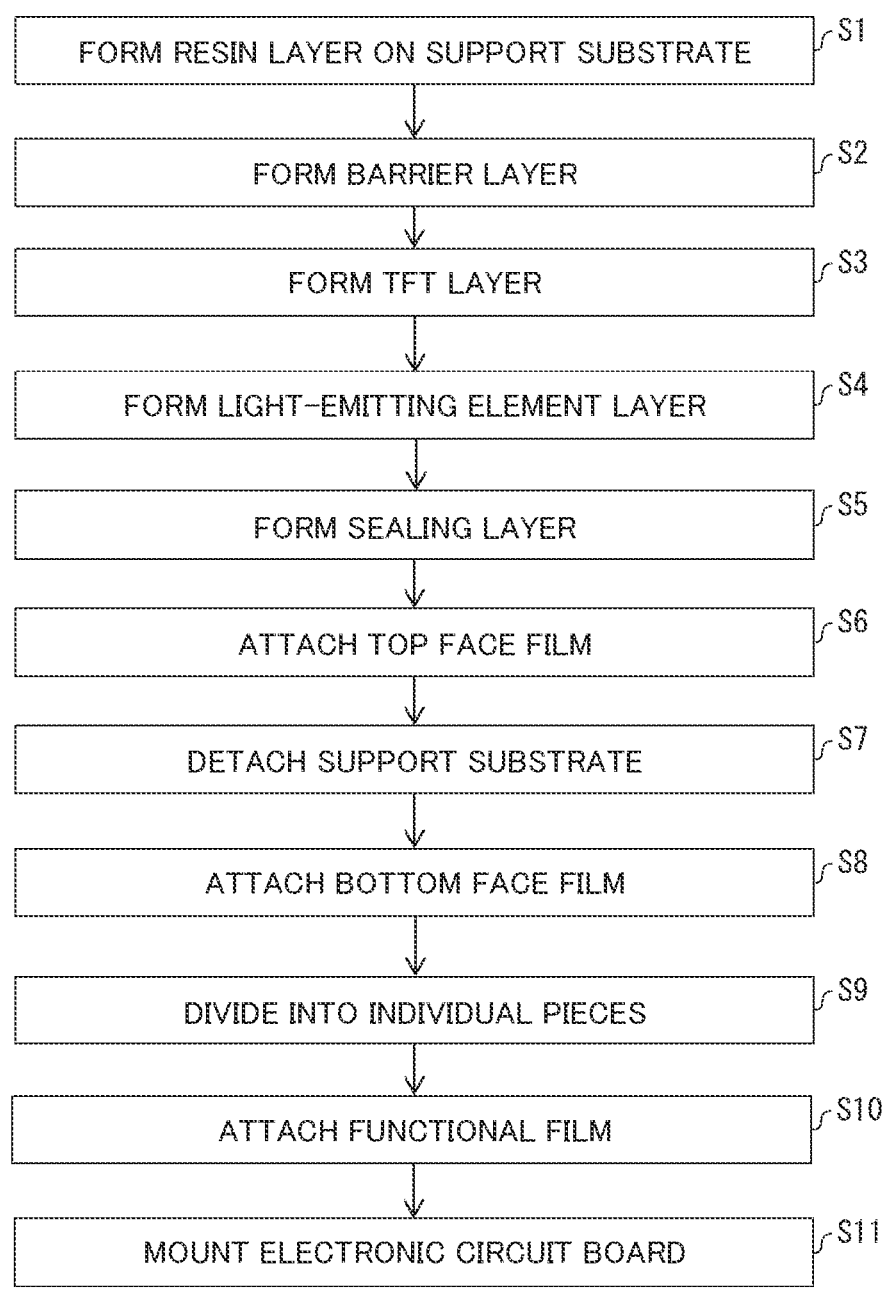
FIG. 1 is a flow chart representing an exemplary method of manufacturing a display device.
Figure 2:
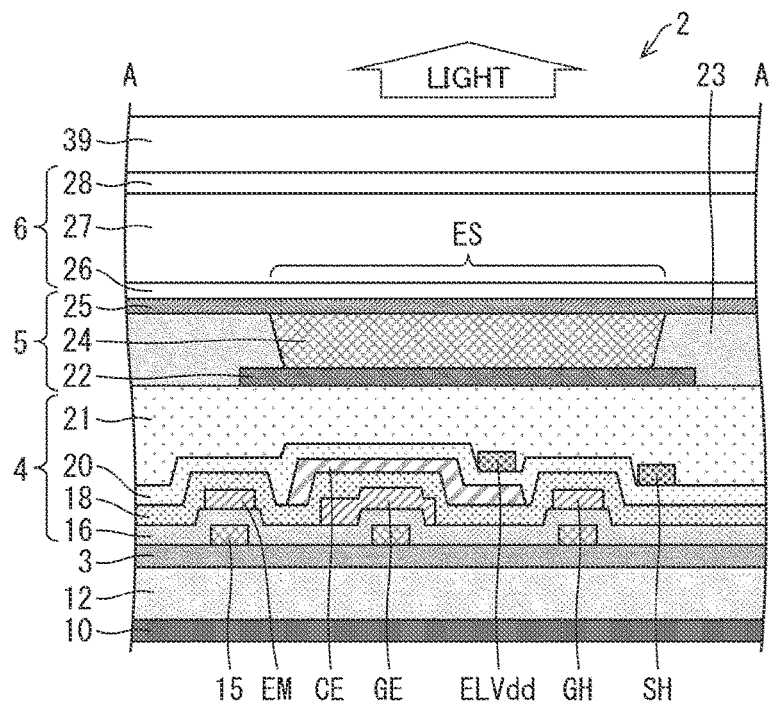
FIG. 2 is a cross-sectional view of an exemplary structure of a display area of the display device.
Figure 3:
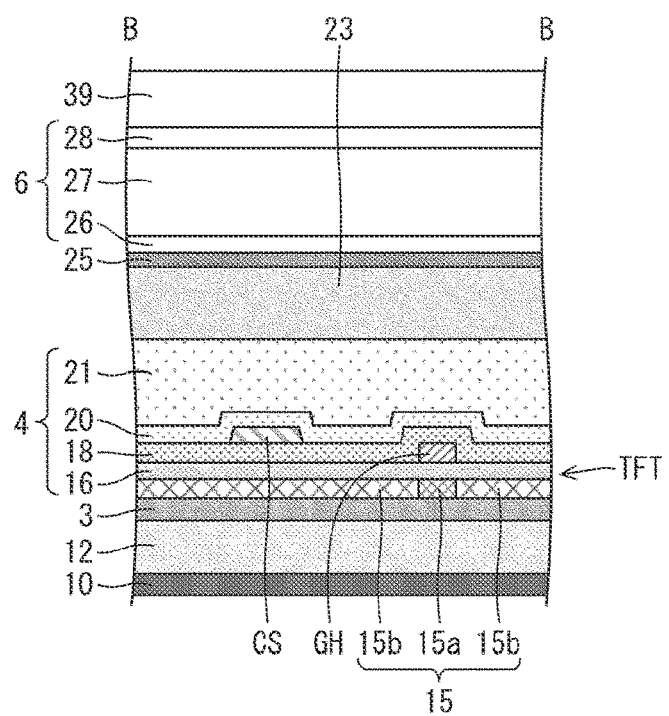
FIG. 3 is a cross-sectional view of another exemplary structure of the display area of the display device.

FIG. 1 is a flow chart representing an exemplary method of manufacturing a display device. FIGS. 2 and 3 are schematic cross-sectional views of an exemplary structure of a display area of a display device 2, taken along lines A-A and B-B in FIG. 6 respectively.

To manufacture a flexible display device, a resin layer 12 is first formed on a transparent support substrate (e.g., mother glass) as shown in FIGS. 1, 2, and 3 (step S1). Next, a barrier layer 3 is formed (step S2). Next, a thin film transistor layer 4 (TFT layer) is formed (step S3). Next, a top-emission light-emitting element layer 5 is formed (step S4). Next, a sealing layer 6 is formed (step S5). Next, a top face film is attached to a sealing layer 6 (step S6).

Next, the support substrate is detached from the resin layer 12 by, for example, laser irradiation (step S7). Next, a bottom face film 10 is attached to the bottom face of the resin layer 12 (step S8). Next, the stack of the bottom face film 10, the resin layer 12, the barrier layer 3, the thin film transistor layer 4, the light-emitting element layer 5, and the sealing layer 6 is divided into individual pieces (step S9). Next, a functional film 39 is attached to the obtained individual pieces (step S10). Next, an electronic circuit board (e.g., an IC chip and a FPC) is mounted to a part (terminal section) pf a portion (non-display area, frame area) outside the display area where there is provided a plurality of subpixels (step S11). Steps S1 to S11 are carried out by display device manufacturing apparatus (including film-forming apparatus that performs steps S1 to S5).

The resin layer 12 is made of, for example, polyimide. The resin layer 12 may be replaced by a combination of two resin films (e.g., polyimide films) and an inorganic insulation film interposed between these two resin films.

The barrier layer 3 prevents foreign materials such as water and oxygen from reaching the thin film transistor layer 4 and the light-emitting element layer 5. The barrier layer 3 may include, for example, a silicon oxide film, a silicon nitride film, a silicon oxynitride film, or a stack of these films. These films can be formed by CVD.

The thin film transistor layer 4 includes: a semiconductor film 15; an inorganic insulation film 16 (gate insulation film) overlying the semiconductor film 15; a gate electrode GE, gate lines GH, and a light-emission control line EM all overlying the inorganic insulation film 16; an inorganic insulation film 18 (interlayer insulation film) overlying the gate electrode GE, the gate lines GH, and the light-emission control line EM; a capacitor electrode CE, a capacitor line CS, and an initialization-potential line Vini (see FIG. 5) overlying the inorganic insulation film 18; an inorganic insulation film 20 (interlayer insulation film) overlying the capacitor electrode CE, the capacitor line CS, and the initialization-potential line Vini; a source line SH and a high potential line ELVdd overlying the inorganic insulation film 20; and a planarization film 21 (interlayer insulation film) overlying the source line SH and the high potential line ELVdd.

The semiconductor film 15 is made of, for example, a low-temperature polysilicon (LTPS) or an oxide semiconductor (e.g., In—Ga—Zn—O-based semiconductor). When the semiconductor film 15 is made of a low-temperature polysilicon, the semiconductor film 15 is doped with P (phosphorus) or like impurity ions after the gate electrodes GE and the gate lines GH are formed, so that the semiconductor film 15 has left undoped a portion 15a thereof that is buried under the overlapping gate electrode GE, gate line GH, or light-emission control line EM and in contrast has remaining portions 15b thereof doped (the portions 15b hence become a conductor). This particular arrangement provides the portion 15a, which serves as a semiconductor, and the portions 15b, which serve as a good conductor, in the semiconductor film 15, thereby forming a top-gate structure, thin film transistor (TFT) as shown in FIG. 3. When the semiconductor film 15 is made of a material other than low-temperature polysilicon, a top-gate structure, thin film transistor is formed by a similar or another process.

The gate electrode GE, the gate line GH, the light-emission control line EM, the capacitor electrode CE, the capacitor line CS, the initialization-potential line Vini, the source line SH, and the high potential line ELVdd are made of, for example, a monolayer or multilayered film of at least one of metals of aluminum, tungsten, molybdenum, tantalum, chromium, titanium, and copper.

The inorganic insulation films 16, 18, and 20 may be made of, for example, a silicon oxide (SiOx) film, a silicon nitride (SiNx) film, a silicon oxynitride (SiNO), or a stack of these films. These films can be formed by CVD. The planarization film 21 is made of, for example, an organic material, such as polyimide or acrylic, that can be provided by printing or coating technology.

The light-emitting element layer 5 includes: an anode 22 ("pixel electrode") overlying the planarization film 21; an insulating edge cover 23 covering the edge of the anode 22; an active layer 24 that is an EL (electroluminescence) layer overlying the edge cover 23; and a cathode 25 ("common electrode") overlying the active layer 24. The edge cover 23 is made, for example, by patterning an applied organic material such as polyimide or acrylic by photolithography.

Each subpixel includes the insular anode 22, the active layer 24, and the cathode 25 and further includes: a light-emitting element ES (electroluminescence element), which is either a QLED or an OLED, in the light-emitting element layer 5; and a subpixel circuit for controlling the light-emitting element ES in the thin film transistor layer 4.

The active layer 24 includes, for example, a hole injection layer, a hole transport layer, a light-emitting layer, an electron transport layer, and an electron injection layer, all of which are provided in this order when viewed from below. The light-emitting layer is formed in an insular manner for each opening in the edge cover 23 (for each subpixel) by vapor deposition or inkjet technology. The other layers are provided in an insular manner or as a common layer across all the openings. One or more of the hole injection layer, the hole transport layer, the electron transport layer, and the electron injection layer may be omitted.

A FMM (fine metal mask) is used as a vapor deposition mask in forming the light-emitting layer for OLEDs by vapor deposition. A FMM is a sheet of, for example, an invar material with numerous vapor deposition holes. An organic material that has passed through a vapor deposition hole forms an insular light-emitting layer (corresponding to one subpixel).

An insular QLED light-emitting layer (corresponding to one subpixel) may be formed, for example, by applying a medium containing dispersed quantum dots by inkjet printing.

The anode 22 includes a stack of, for example, ITO (indium tin oxide) and either Ag (silver) or a Ag-containing alloy or is made of, for example, Ag- or Al-containing material, so that the anode 22 can be light-reflecting, reflective electrode. The cathode (cathode) 25 is a transparent electrode made of a thin film of Ag, Au, Pt, Ni, or Ir, a thin film of a Mg—Ag alloy, or a transparent conductive member such as ITO or IZO (indium zinc oxide). When the display device is a bottom-emission type, not a top-emission type, the bottom face film 10 and the resin layer 12 are transparent, the anode 22 is a transparent electrode, and the cathode 25 is a reflective electrode.

In the light-emitting element ES, holes and electrons recombine in the light-emitting layer due to a drive current flowing between the anode 22 and the cathode 25, to produce excitons that transition from the lowest unoccupied molecular orbital (LUMO) or conduction band energy level (conduction band) to the highest occupied molecular orbital (HOMO) or valence band energy level (valence band) of the quantum dot to emit light.

The sealing layer 6 is transparent and includes: an inorganic sealing film 26 covering the cathode 25; an organic buffer film 27 overlying the inorganic sealing film 26; and an inorganic sealing film 28 overlying the organic buffer film 27. The sealing layer 6, covering the light-emitting element layer 5, prevents foreign materials such as water and oxygen from reaching the light-emitting element layer 5.

The inorganic sealing film 26 and the inorganic sealing film 28 are inorganic insulation films and may each include, for example, a silicon oxide film, a silicon nitride film, a silicon oxynitride film, or a stack of these films. These films can be formed by CVD. The organic buffer film 27 is a transparent organic film that exhibits a planarization effect. The organic buffer film 27 may be made of an organic material, such as acrylic, that can be provided by printing or coating technology. The organic buffer film 27 may be formed, for example, by inkjet printing. There may be provided a bank in the non-display area to stop liquid droplets.

The bottom face film 10 is, for example, a PET film attached to the bottom face of the resin layer 12 after the support substrate is detached, thereby providing for a highly flexible display device. The functional film 39 has, for example, at least one of an optical compensation function, a touch sensor function, and a protection function.

The description has so far focused on the flexible display device. To manufacture a non-flexible display device, since there is generally no need to, for example, form a resin layer and replace the base material, for example, layer-forming steps S2 to S5 are carried out on the glass substrate before one proceeds to step S9. To manufacture a non-flexible display device, a transparent sealing member may be attached in a nitrogen atmosphere using an adhesive sealant, instead of, or in addition to, the formation of the sealing layer 6. The transparent sealing member may be made of glass or plastic and is preferably concave.

An embodiment of the disclosure relates particularly to the formation pattern of the semiconductor film 15 formed in step S3 in the aforementioned method of manufacturing the display device.

Comparative Examples

Figure 4:
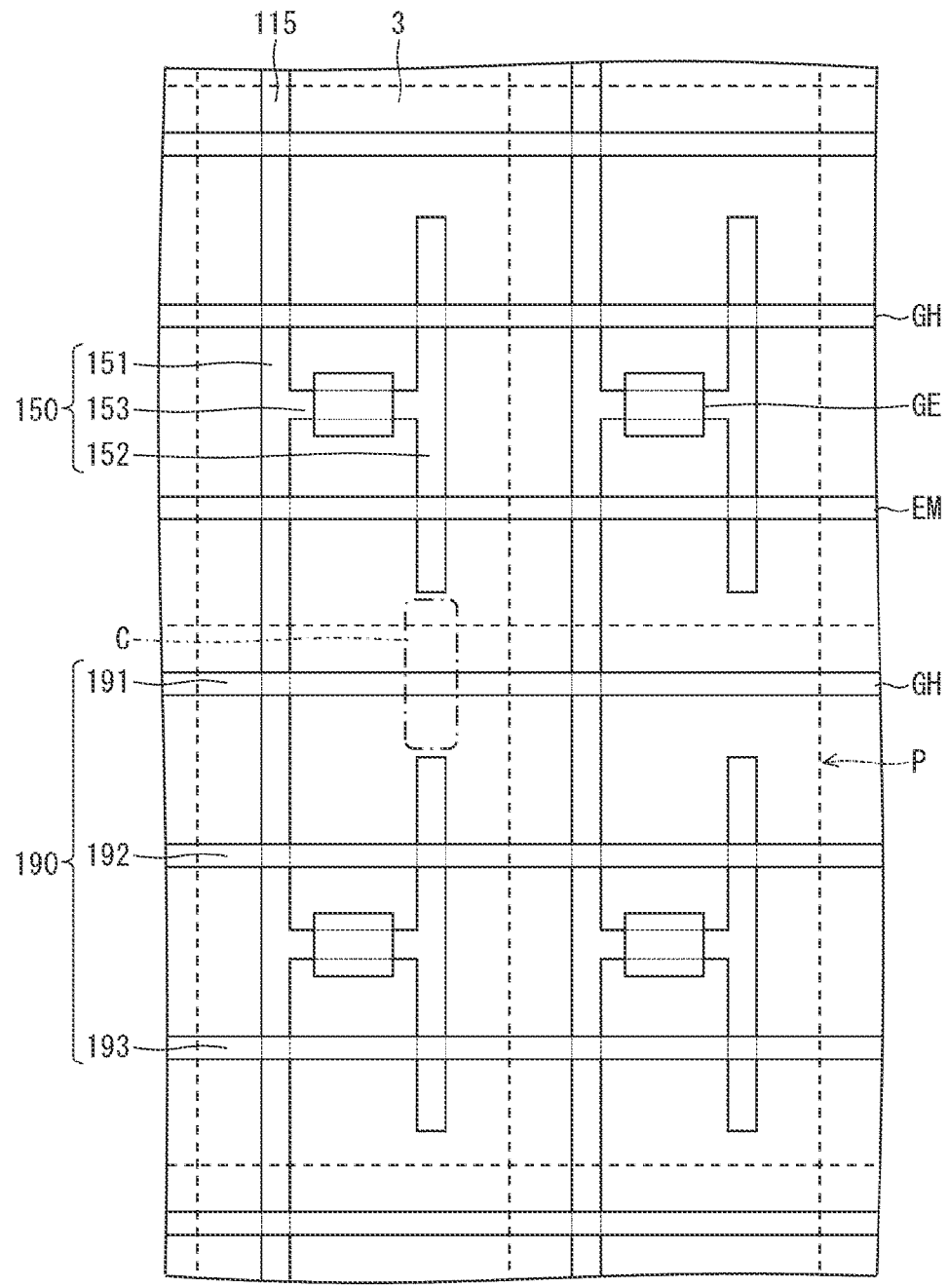
FIG. 4 is a schematic plan view of an exemplary formation pattern of a semiconductor film and an exemplary formation pattern of gate electrodes and control lines in a display area of a display device for a comparative example.

FIG. 4 is a schematic plan view of an exemplary formation pattern of a semiconductor film 115 and an exemplary formation pattern of the gate electrodes GE and control lines 190 in a display area of a display device in accordance with a comparative example. In FIG. 4 and other schematic plan views referred to later in the description, a coarse broken line is used to show a boundary of a subpixel P, whereas a fine broken line is used to show a profile line of a formation pattern hidden by another, overlapping formation pattern.

A thin film transistor layer in accordance with the comparative example resides on the barrier layer 3 and is a stack of (i) the semiconductor film 115, (ii) the inorganic insulation film 16 (gate insulation film), (iii) the gate electrode GE and the control line 190, (iv) the inorganic insulation film 18 (interlayer insulation film), (v) the capacitor electrode CE, the capacitor line CS, and the initialization-potential line Vini, (vi) the inorganic insulation film 20 (interlayer insulation film), the source line SH, and the high potential line ELVdd, and (viii) the planarization film 21, all of which are provided in this order.

The semiconductor film 115 constitutes parts of thin film transistors and provides a connecting semiconductor layer 150 connecting the thin film transistors.

The control lines 190 include a first control line 191, a second control line 192, and a third control line 193, all extending in the row direction (the up/down direction in FIG. 4). The source line SH and the high potential line ELVdd extend in the column direction (the left and right direction in FIG. 4) which is substantially perpendicular to the row direction.

Referring to FIG. 4, the connecting semiconductor layer 150 in accordance with the comparative example includes (i) a first connecting semiconductor layer 151 extending generally in the column direction over a column-direction string of subpixels P, (ii) a second connecting semiconductor layer 152 extending generally in the column direction on a row-direction side (on the right side in FIG. 4) of the first connecting semiconductor layer 151 in each subpixel P, and (iii) a third connecting semiconductor layer 153 extending generally in the row direction between the first connecting semiconductor layer 151 and the second connecting semiconductor layer 152 to connect the second connecting semiconductor layer 152 to the first connecting semiconductor layer 151 in each subpixel P.

The thin film transistor layer in accordance with the comparative example likely causes unwanted cracks in the inorganic insulation film 16. The cracks can in turn undesirably lead to other cracks in a conductive layer for providing the gate electrodes GE and the control lines 190, causing breaks in the control lines 190 after the conductive layer is patterned.

The support substrate may bend upward or downward together with the resin layer 12, the barrier layer 3, and the connecting semiconductor layer 150 on the support substrate, due to differences in heat expansion in forming the inorganic insulation film 16, which could cause and develop cracks in the barrier layer 3 and the inorganic insulation film 16. The support substrate may also bend upward or downward together with the resin layer 12, the barrier layer 3, the connecting semiconductor layer 150, and the inorganic insulation film 16 on the support substrate, due to differences in heat expansion in forming a conductive layer for providing the gate electrodes GE and the control lines 190, which could cause and develop cracks in the barrier layer 3 and the inorganic insulation film 16. Since the connecting semiconductor layer 150, restraining the column-wise bending of the support substrate, renders the support substrate more susceptible to bend in the row direction due to stress concentration, these cracks will likely form so as to extend in the primary extension direction of the connecting semiconductor layer 150, that is, in the column direction. The control lines 190, extending in the column direction, are therefore more susceptible to breaks due to the cracks.

Conception and Development of Disclosure

A brief description is now given of how the inventors have conceived and developed the disclosure.

The inventors checked the control lines 190 for breaks when the gate electrodes GE and the control lines 190 were formed in the production of the thin film transistor layer in accordance with the comparative example. The inventors further inspected the product in process in which breaks were detected, for cracks in the inorganic insulation film 16.

From this inspection, the inventors found that all the cracks in the inorganic insulation film 16 extended above those regions where the connecting semiconductor layer 150 was missing. The inventors inferred from this fact that the connecting semiconductor layer 150, that is, the semiconductor film 115 prevented the occurrence and growth of cracks in the inorganic insulation film 16.

The inventors further found that many of the cracks in the inorganic insulation film 16 occurred in an area C surrounded by a dash-dot line in FIG. 4 and that many of the broken control lines 190 were the first control lines 191 with breaks in the area C. The area C is located between those second connecting semiconductor layers 152 which are adjacent to each other in the column direction. The inventors inferred from this fact that in the inorganic insulation film 16, cracks tended to form and grow in the regions where the connecting semiconductor layer 150 was missing, especially along extensions of the connecting semiconductor layer 150.

The inventors have conceived and developed the disclosure from these findings.

Embodiment 1

The following will describe an embodiment of the disclosure in detail with reference to drawings. Shapes, dimensions, relative positions, circuit constructions, and other related factors depicted in the drawings are mere examples and do not provide any basis on which the scope of the invention should be narrowly construed.

The display device 2 in accordance with present Embodiment 1 operates by progressive scanning where pixels are driven a row at a time from the first row to the N-th row, which by no means limits the scope of the disclosure. It would be appreciated by a person skilled in the art that the disclosure is equally applicable to a display device that operates by interlaced scanning.

The display device 2 in accordance with present Embodiment 1 includes the plurality of subpixels P, one for each intersection of a plurality of control signal lines and a plurality of data signal lines. The subpixel P in row n, column m will be referred to as the subpixel P(n,m) throughout the following description, and the description will focus on the subpixel P(n,m). The n-th one of row-direction strings of subpixels will be referred to as the row of subpixels P(n), whereas the m-th one of column-direction strings of subpixels will be referred to as the column of subpixels P(m).

Subpixel Circuit

Figure 5:
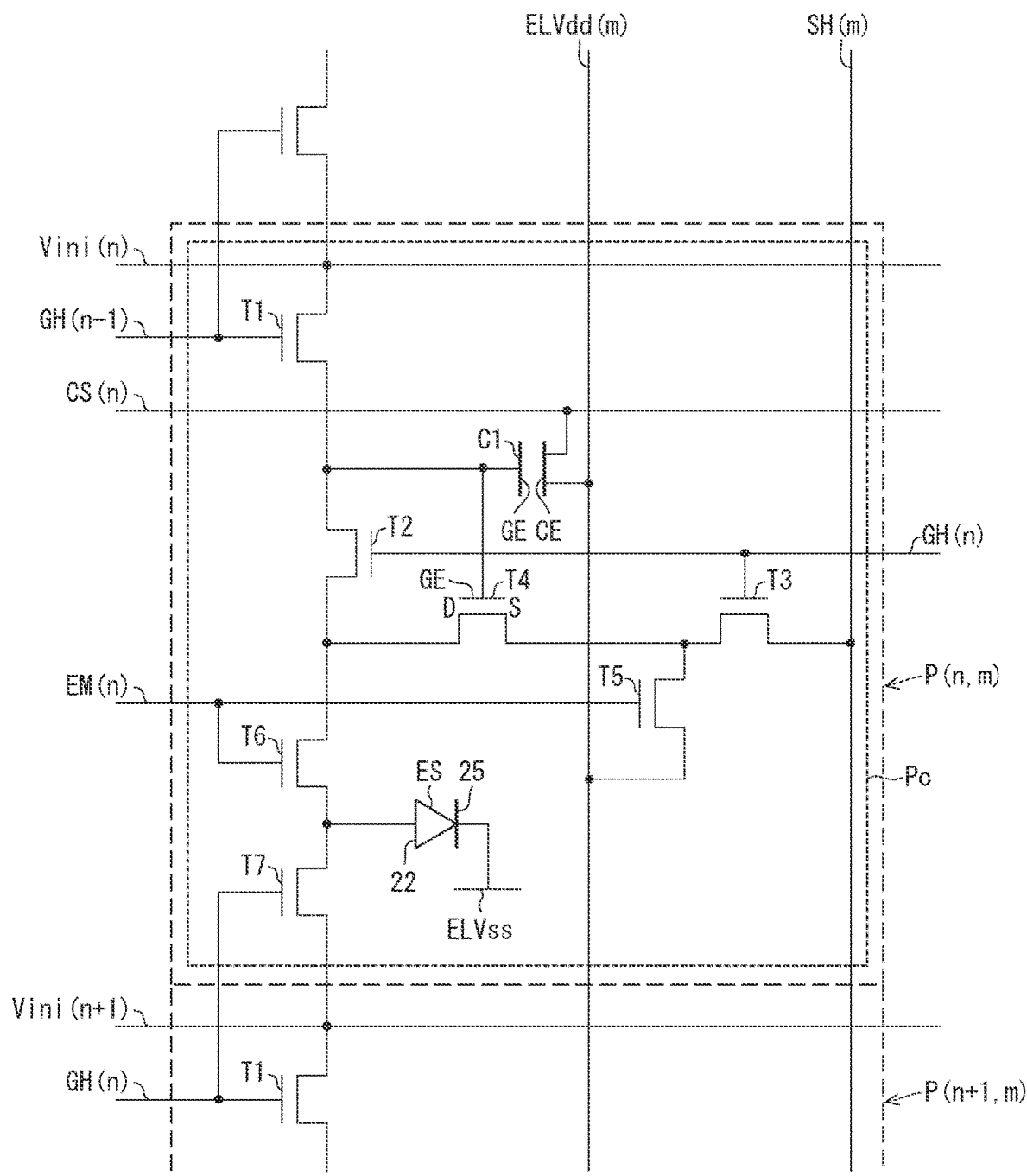
FIG. 5 is a schematic circuit diagram of an exemplary circuit structure of a subpixel circuit in a subpixel P in a display device in accordance with Embodiment 1 of the disclosure.

FIG. 5 is a schematic circuit diagram of an exemplary circuit structure of a subpixel circuit Pc in the subpixel P(n,m) in the display device 2 in accordance with present Embodiment 1.

Referring to FIG. 5, the subpixel P(n,m) includes the subpixel circuit Pc. The subpixel circuit Pc in the subpixel P(n,m) includes the light-emitting element ES, a first thin film transistor T1 to a seventh thin film transistor T7, and a capacitance C1 and is connected to a gate line GH(n) for a current stage and a gate line GH(n−1), a light-emission control line EM(n), a source line SH(m), a high potential line ELVdd(m), a low potential line ELVss, a capacitor line CS(n), and an initialization-potential line Vini(n) all for a preceding stage.

The first thin film transistor T1 is alternatively referred to as the first initialization transistor. The second thin film transistor T2 is alternatively referred to as the threshold-compensation transistor. The third thin film transistor T3 is alternatively referred to as the write transistor. The fourth thin film transistor T4 is alternatively referred to as the drive transistor. The fifth thin film transistor T5 is alternatively referred to as the power supply transistor. The sixth thin film transistor T6 is alternatively referred to as the light emission control transistor. The seventh thin film transistor T7 is alternatively referred to as the second initialization transistor.

In the present specification, the "gate line for the current stage" refers to the gate line to which a scan control signal corresponding to the extending row of pixels (i.e., the "current stage") is fed. The "n" in the "gate line GH(n) for the current stage" refers not to the extending row of pixels, but to a row of pixels corresponding to an input signal. Likewise, the "gate line for the preceding stage" refers to the gate line to which a scan control signal corresponding to a row of pixels that precedes the extending row of pixels (i.e., the preceding stage) is fed. The "n−1" in the "gate line GH(n−1) for the preceding stage" refers not to the extending row of pixels, but to a row of pixels corresponding to an input signal. The "n" in the "light-emission control line EM(n)" also refers to a row of pixels corresponding to an input signal.

Meanwhile, the symbols, n and m, in the "high potential line ELVdd(m)," the "initialization-potential line Vini(n)," and a "capacitor line (n)" simply denote a location. A constant voltage is fed to each line.

The input signal to the gate line GH(n) for the current stage is a scan control signal for the current stage that has (i) such an electrical potential level as to turn on the second thin film transistor T2 and the third thin film transistor T3 in a period in which a signal voltage corresponding to image data is written to the capacitance C1 for the row of subpixels P(n), that is, for the current stage, and (ii) such an electrical potential level as to turn off the second thin film transistor T2 and the third thin film transistor T3 in the other periods. The gate line GH(n) for the current stage extends in the row direction in the row of subpixels P(n).

The input signal to the gate line GH(n−1) for the preceding stage is a scan control signal for the preceding stage that has such an electrical potential level as to turn on the first thin film transistor T1 in the subpixel P(n,m) and the seventh thin film transistor T7 in the subpixel P(n−1,m) in a period in which a signal voltage is written to the capacitance C1 for a row of subpixels P(n−1) scanned before the row of subpixels P(n), that is, for the preceding stage, and such an electrical potential level as to turn off these first and seventh thin film transistors T1 and T7 in the other periods. The gate line GH(n−1) for the preceding stage extends in the row direction not in the row of subpixels P(n−1), but in the row of subpixels P(n).

The input signal to the light-emission control line EM(n) is a light-emission control signal that has such an electrical potential level as to turn on the fifth thin film transistor T5 and the sixth thin film transistor T6 in a period in which the light-emitting element ES for the row of subpixels P(n), that is, for the current stage, emits light and such an electrical potential level as to turn off the fifth thin film transistor T5 and the sixth thin film transistor T6 in the other periods. The light-emission control line EM(n) extends in the row direction in the row of subpixels P(n).

The source line SH(m) is a data signal line for feeding a data signal potential based on image data to a first one of the electrodes of the capacitance C1 in the column of subpixels P(m) and to the gate terminal (i.e., the gate electrode GE) of the fourth thin film transistor T4 (serving as a drive transistor for controlling the amount of current flowing in the light-emitting element ES) via the third thin film transistor T3, the fourth thin film transistor T4, and the second thin film transistor T2 in this order. The source line SH(m) extends in the column direction in the column of subpixels P(m).

The high potential line ELVdd(m) is a power line for feeding a HIGH power supply voltage to a second one of the electrodes of the capacitance C1 opposite the first electrode of the capacitance C1 in the column of subpixels P(m). The high potential line ELVdd(m) feeds a HIGH power supply voltage also to the anode 22 (see FIG. 2) of the light-emitting element ES in the column of subpixels P(m) via the fifth thin film transistor T5, the fourth thin film transistor T4, and the sixth thin film transistor T6 in this order. The high potential line ELVdd(m) extends in the column direction in the column of subpixels P(m).

The low potential line ELVss(m) is a power line for feeding a LOW power supply voltage to the cathode 25 (see FIG. 2) of the light-emitting element ES.

Figure 6:
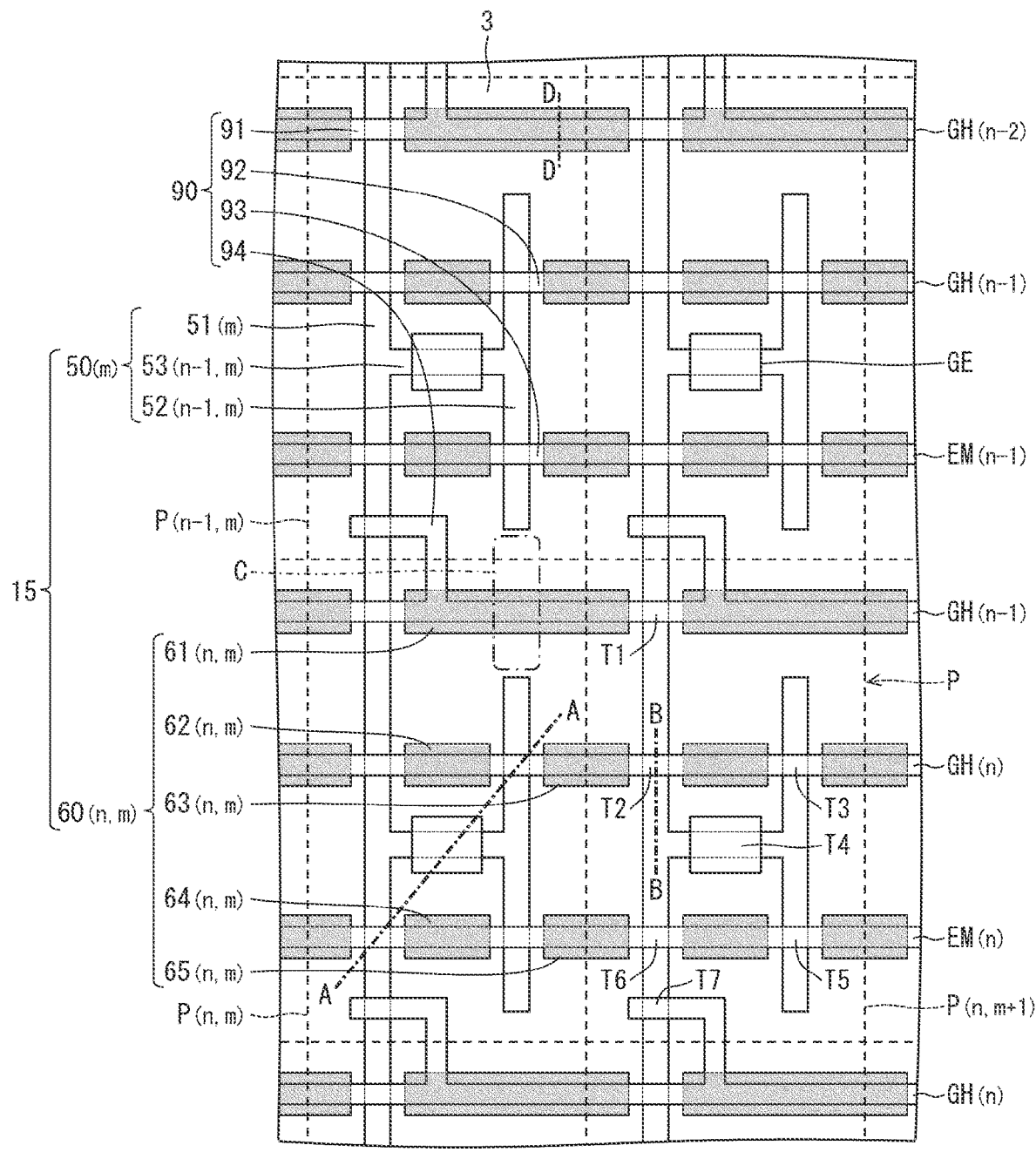
FIG. 6 is a schematic plan view of an exemplary formation pattern of a semiconductor film and an exemplary formation pattern of gate electrodes, gate lines, and light-emission control lines, all of which are laid out to provide a subpixel circuit Pc shown in FIG. 5, in a display area of the display device in accordance with Embodiment 1 of the disclosure.

The subpixel circuit Pc in the subpixel P(n,m) is connected further to the gate line GH(n) and the initialization-potential line Vini(n+1) via the seventh thin film transistor T7. The gate line GH(n) is a different gate line from the gate line GH(n) for the current stage passing through the row of subpixels P(n) for the current stage as shown in FIG. 6 (which will be described later). However, the same scan control signal is fed to these two gate lines GH(n).

FIG. 5 shows an example where the subpixel circuit Pc includes seven thin film transistors (T1 to T7). The scope of the disclosure is not necessarily limited to such an example. Alternatively, the subpixel circuit may include, for example, fewer or more than seven thin film transistors.

Layered Structure of Thin Film Transistor Layer

Referring to FIGS. 2 and 3, the thin film transistor layer 4 in accordance with present Embodiment 1 is a layered body stacked on the barrier layer 3 on the support substrate (substrate). The layered body includes (i) a semiconductor layer including the semiconductor film 15, (ii) the inorganic insulation film 16 (gate insulation film), (iii) wiring (first wiring) including the gate electrode GE and control lines such as the gate line GH and the light-emission control line EM, (iv) the inorganic insulation film 18 (interlayer insulation film), (v) wiring (third wiring) including, for example, the capacitor electrode CE, the capacitor line CS, and the initialization-potential line Vini (see FIG. 5), (vi) the inorganic insulation film 20, (vii) wiring (second wiring) including the source line SH and the high potential line ELVdd, and (viii) the planarization film 21, all of which are provided in this order. Similarly to the gate line GH, the capacitor line CS extends in the lateral direction and is fed with the same HIGH power supply voltage as is the high potential line ELVdd extending in the vertical direction (see FIG. 5).

Formation Pattern

Figure 7:
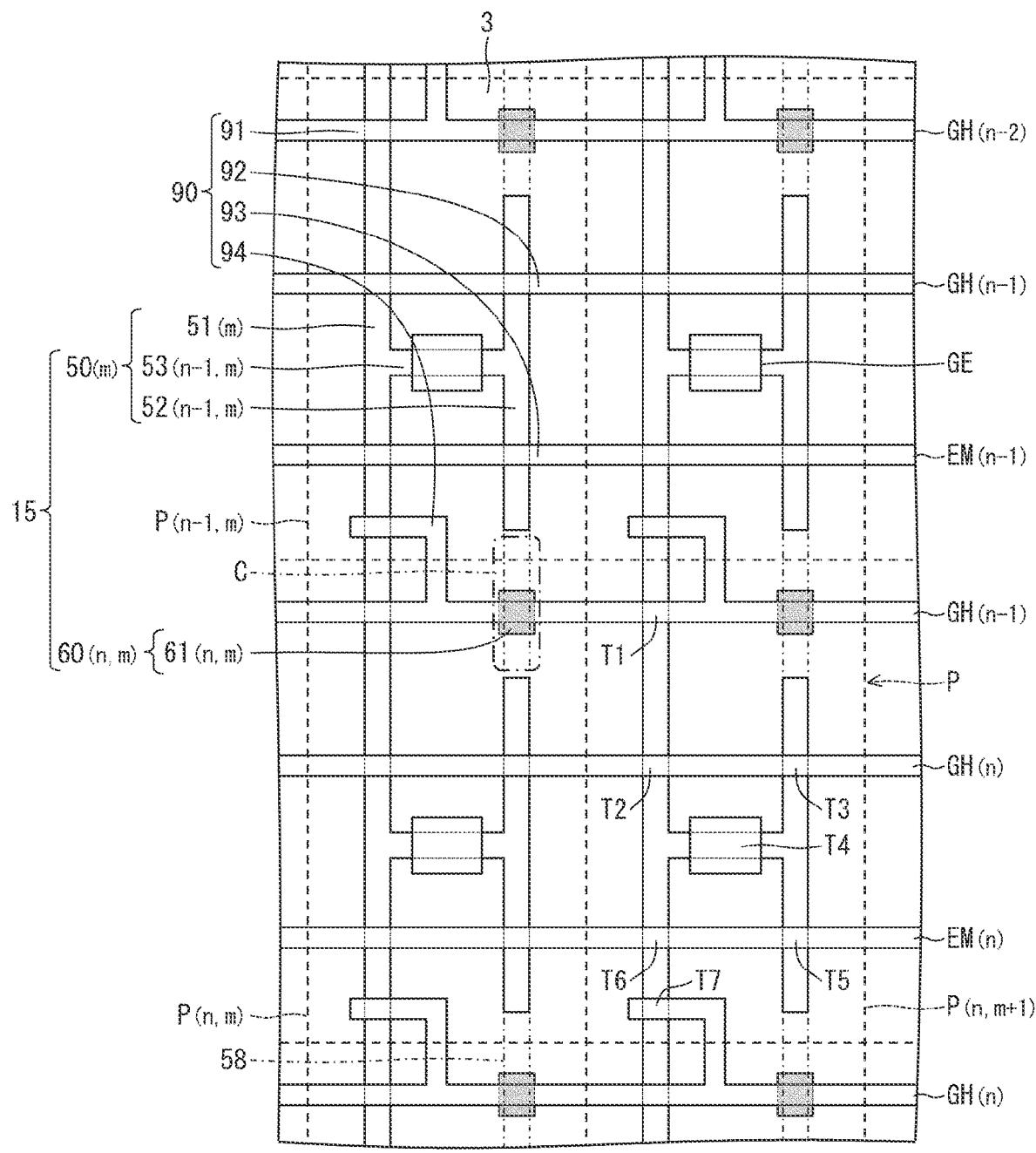
FIG. 7 is a schematic plan view of another exemplary formation pattern of the semiconductor film and another exemplary formation pattern of the gate electrodes, gate lines, and light-emission control lines, all of which are laid out to provide the subpixel circuit Pc shown in FIG. 5, in the display area of the display device in accordance with Embodiment 1 of the disclosure.

FIG. 6 is a schematic plan view of an exemplary formation pattern of the semiconductor film 15 and an exemplary formation pattern of the gate electrodes GE, the gate lines GH, and the light-emission control lines EM, all of which are laid out to provide the subpixel circuit Pc shown in FIG. 5, in the display area of the display device 2 in accordance with present Embodiment 1. FIG. 7 is a schematic plan view of another exemplary formation pattern of the semiconductor film 15 and another exemplary formation pattern of the gate electrodes GE, the gate lines GH, and the light-emission control lines EM, all of which are laid out to provide the subpixel circuit Pc shown in FIG. 5, in the display area of the display device 2 in accordance with present Embodiment 1. Insular semiconductor layers 60 are hatched in FIGS. 6 and 7 for better understanding of the disclosure. The cross-sectional view taken along line A-A in FIG. 6 corresponds to FIG. 2, the cross-sectional view taken along line B-B in FIG. 6 corresponds to FIG. 3, and the cross-sectional view taken along line D-D in FIG. 6 corresponds to FIG. 8.

Referring to FIGS. 6 and 7, the formation pattern of the semiconductor film 15 provides a plurality of connecting semiconductor layers 50 and the plurality of insular semiconductor layers 60 in the display area of the display device 2 in accordance with present Embodiment 1. Control lines 90 in the row of subpixels P(n) include: a first control line 91 that provides the gate line GH(n−1) for the preceding stage; a second control line 92 that provides the gate line GH(n) for the current stage; and a third control line 93 that provides the light-emission control line EM(n).

Connecting Semiconductor Layer

One connecting semiconductor layer 50 is provided for each column of subpixels. The segment, of each connecting semiconductor layer 50, that is provided in each subpixel P constitutes parts of the thin film transistors T1 to T7 and also connects these thin film transistors T1 to T7. The connecting semiconductor layer 50 for the column of subpixels P(m) will be referred to as the connecting semiconductor layer 50(m) throughout the following description.

The connecting semiconductor layer 50(m) includes: one first connecting semiconductor layer 51(m) for a plurality of subpixels P(1,m) to (N,m); a plurality of second connecting semiconductor layers 52(1,m) to 52(N,m) in the plurality of subpixels P(1,m) to (N,m) respectively; and a plurality of third connecting semiconductor layers 53(1,m) to 53(N,m) in the plurality of subpixels P(1,m) to (N,m) respectively.

The first connecting semiconductor layer 51(m) extends generally in the column direction (the up/down direction in FIGS. 6 and 7) and is provided for the plurality of subpixels P(1,m) to (N,m). The first connecting semiconductor layer 51(m) intersects, in the subpixel P(n,m), with the first control line 91, the second control line 92, and the third control line 93 all passing through the subpixel P(n,m) sequentially from a column-direction end toward the other end (from the top end toward the bottom end in FIGS. 6 and 7) and intersects with a branch line 94 that branches off the first control line 91 passing through a subpixel P(n+1,m) for a succeeding stage. The first connecting semiconductor layer 51(m) constitutes a part of the first thin film transistor T1 at an intersection thereof with the first control line 91, a part of the second thin film transistor T2 at an intersection thereof with the second control line 92, a part of the sixth thin film transistor T6 at an intersection thereof with the third control line 93, and a part of the seventh thin film transistor T7 at an intersection thereof with the branch line 94.

The second connecting semiconductor layer 52(n,m) extends generally in the column direction and resides on a row-direction side of the associated, first connecting semiconductor layer 51(m) (on the right side in FIGS. 6 and 7). The second connecting semiconductor layer 52(n,m) does not intersect with the first control line 91 or the branch line 94, but intersects with the second control line 92 and the third control line 93 sequentially from a column-direction end toward the other end (from the top end toward the bottom end in FIGS. 6 and 7). The second connecting semiconductor layer 52(n,m) constitutes a part of the third thin film transistor T3 at an intersection thereof with the second control line 92 and a part of the fifth thin film transistor T5 at an intersection thereof with the third control line 93.

The third connecting semiconductor layer 53(n,m) extends generally in the row direction (in the left and right direction in FIGS. 6 and 7) and resides between the associated, first connecting semiconductor layer 51(m) and the associated, second connecting semiconductor layer 52(n,m). The third connecting semiconductor layer 53(n,m) connects the associated, second connecting semiconductor layer 52(n, m) to the associated, first connecting semiconductor layer 51(m). The third connecting semiconductor layer 53(n,m) does not intersect with any of the control lines 90 or the branch line 94, but intersects with the gate electrode GE. The third connecting semiconductor layer 53(n,m) includes a channel region opposite the gate electrode GE and constitutes a part of the fourth thin film transistor T4 at an intersection thereof with the gate electrode GE.

FIGS. 6 and 7 show an example where the subpixel P is rectangular. The scope of the disclosure is not necessarily limited to such an example. Alternatively, the subpixel P may be non-rectangular and may have a complex shape.

FIGS. 6 and 7 show an example where the first connecting semiconductor layer 51, the second connecting semiconductor layer 52, and the third connecting semiconductor layer 53 are each shaped like a straight line. The scope of the disclosure is not necessarily limited to such an example. Alternatively, for instance, one or more of the first connecting semiconductor layer 51, the second connecting semiconductor layer 52, and the third connecting semiconductor layer 53 may wobble. As another alternative example, the connecting semiconductor layer 50 may include a fourth or any more additional connecting semiconductor layers.

Insular Semiconductor Layer

The insular semiconductor layers 60 are hatched in the semiconductor film 15 in FIGS. 6 and 7 as described earlier. The insular semiconductor layers 60 are electrically isolated. Specifically, the insular semiconductor layers 60 are electrically separated from one another and also from the connecting semiconductor layer 50 in the same layer and have the top and bottom faces thereof covered entirely with an insulation layer. The insular semiconductor layers 60, thus isolated, can only affect the electric circuitry in the display device 2 through the parasitic capacitance thereof.

In the example shown in FIG. 6, the insular semiconductor layer 60 in the subpixel P(n,m) includes a single first insular semiconductor layer 61, a single second insular semiconductor layer 62, a single third insular semiconductor layer 63, a single fourth insular semiconductor layer 64, and a single fifth insular semiconductor layer 65. The insular semiconductor layer 60 in the subpixel P(n,m) is by not necessarily limited to such an example. Alternatively, for example, the insular semiconductor layer 60 in the subpixel P(n,m) may only include the first insular semiconductor layer 61 as shown in FIG. 7.

Throughout the following description, the insular semiconductor layer 60, the first insular semiconductor layer 61, the second insular semiconductor layer 62, the third insular semiconductor layer 63, the fourth insular semiconductor layer 64, and the fifth insular semiconductor layer 65 in the subpixel P(n,m) will be referred to as the insular semiconductor layer 60(n,m), the first insular semiconductor layer 61(n,m), the second insular semiconductor layer 62(n,m), the third insular semiconductor layer 63(n,m), the fourth insular semiconductor layer 64(n,m), and the fifth insular semiconductor layer 65(n,m) respectively.

The first insular semiconductor layer 61(n,m) is provided, in a plan view taken normal to the support substrate, overlapping a portion of the first control line 91 between (i) the first connecting semiconductor layer 51(m) included in the connecting semiconductor layer 50(m) and (ii) the first connecting semiconductor layer 51(m+1) included in another connecting semiconductor layer 50(m+1) adjacent to the connecting semiconductor layer 50(m) on a row-direction side of the connecting semiconductor layer 50(m) (on the right side in FIGS. 6 and 7). In other words, the first insular semiconductor layer 61(n,m) is provided between the first thin film transistor T1 in the subpixel P(n,m) and the first thin film transistor T1 in a subpixel P(n,m+1) so as to overlap a portion of the first control line 91.

The first insular semiconductor layer 61(n,m) is preferably provided at least overlapping an intersection of the first control line 91 and an second imaginary line 58 connecting the second connecting semiconductor layer 52(n,m) to a second connecting semiconductor layer 52(n−1,m) adjacent thereto in the column direction as shown in FIG. 7. In other words, the first insular semiconductor layer 61(n,m) is preferably provided at least inside the area C so as to overlap a portion of the first control line 91. The area C shown in FIGS. 6 and 7 resides between those second connecting semiconductor layers 52 which are adjacent to each other in the column direction.

The second insular semiconductor layer 62(n,m) is provided, in a plan view, overlapping a portion of the second control line 92 between (i) the first connecting semiconductor layer 51(m) included in the connecting semiconductor layer 50(m) and (ii) the second connecting semiconductor layer 52(n,m) included in the same the connecting semiconductor layer 50(m). In other words, the second insular semiconductor layer 62(n,m) is provided between the second thin film transistor T2 and the third thin film transistor T3 in the subpixel P(n,m), so as to overlap a portion of the second control line 92.

The third insular semiconductor layer 63(n,m) is provided, in a plan view, overlapping a portion of the second control line 92 between (i) the second connecting semiconductor layer 52(n,m) included in the connecting semiconductor layer 50(m) and (ii) the first connecting semiconductor layer 51(m+1) included in the other connecting semiconductor layer 50(m+1) adjacent to the connecting semiconductor layer 50(m) on a row-direction side of the connecting semiconductor layer 50(m). In other words, the third insular semiconductor layer 63(n,m) is provided between the third thin film transistor T3 in the subpixel P(n,m) and the second thin film transistor T2 in the subpixel P(n,m+1), so as to overlap a portion of the second control line 92.

The fourth insular semiconductor layer 64(n,m) is provided, in a plan view, overlapping a portion of the third control line 93 between (i) the first connecting semiconductor layer 51(m) included in the connecting semiconductor layer 50(m) and (ii) the second connecting semiconductor layer 52(n,m) included in the same the connecting semiconductor layer 50(m). In other words, the fourth insular semiconductor layer 64(n,m) is provided between the sixth thin film transistor T6 in the subpixel P(n,m) and the fifth thin film transistor T5 in the subpixel P(n,m+1), so as to overlap a portion of the third control line 93.

The fifth insular semiconductor layer 65 (n,m) is provided, in a plan view, overlapping a portion of the third control line 93 between (i) the second connecting semiconductor layer 52(n,m) included in the connecting semiconductor layer 50(m) and (ii) the first connecting semiconductor layer 51(m+1) included in the other connecting semiconductor layer 50(m+1) adjacent to the connecting semiconductor layer 50(m) on a row-direction side of the connecting semiconductor layer 50(m). In other words, the fifth insular semiconductor layer 65 (n,m) is provided between the fifth thin film transistor T5 in the subpixel P(n,m) and the sixth thin film transistor T6 in the subpixel P(n,m+1), so as to overlap a portion of the third control line 93.

The term "overlap" in the present specification does not exclusively refer to complete matching in a plan view unless explicitly mentioned otherwise. For instance, the term is also applicable to a structure in which a part of the insular semiconductor layer 60 is buried under an associated portion of the control line 90 and the remaining part of the insular semiconductor layer 60 is exposed out of the associated portion of the control line 90.

Effects of Insular Semiconductor Layer

One of the aforementioned findings made by the inventors indicates that the insular semiconductor layer 60(n,m) prevents the occurrence and growth of cracks in the overlying inorganic insulation film 16. The insular semiconductor layer 60 in FIGS. 6 and 7 therefore prevents the occurrence and growth of cracks in the inorganic insulation film 16 under the associated portions of the control lines 90, thereby preventing the associated control lines 90 from breaking.

Another one of the aforementioned findings made by the inventors indicates that many cracks are found in the area C in FIG. 4 in the comparative example. As a result, the first control line 191 has the most breaks. Accordingly, the insular semiconductor layer 60 may only include the first insular semiconductor layer 61, and the first insular semiconductor layer 61 may only be provided in the area C, as shown in FIG. 7. This structure can restrain the parasitic capacitance caused by the insular semiconductor layer 60 and prevent the occurrence and growth of cracks in the inorganic insulation film 16 with a high degree of certainty, thereby preventing crack-caused breaks in the first control line 91 with a high degree of certainty.

The insular semiconductor layer 60 may be provided overlapping the largest possible area of those portions of the control line 90 under which there is provided no connecting semiconductor layer 50 as shown in FIG. 6. The insular semiconductor layer 60 causes a larger parasitic capacitance in this structure than in the structure shown in FIG. 7. The structure in FIG. 6 can however reliably prevent the occurrence and growth of cracks in the inorganic insulation film 16, thereby reliably preventing crack-caused breaks in the first control line 91 and reliably preventing breaks in the second control line 92 and the third control line 93. The insular semiconductor layers 60 are arranged in the column direction In FIG. 6. The stack of the support substrate (substrate), the resin layer 12, and the barrier layer 3 will therefore more unlikely bend in the column direction than in a known structure in which there is provided no insular semiconductor layer 60. The structure in FIG. 6 hence restrains bending of the inorganic insulation film 16 when the inorganic insulation film 16 is formed. The inorganic insulation film 16 will therefore unlikely develop cracks.

The insular semiconductor layers 60 do not necessarily have the structure shown in FIG. 6 or 7. The insular semiconductor layers 60 may, for example, have a structure that is intermediate between FIGS. 6 and 7.

Width of Insular Semiconductor Layer

Figure 8:
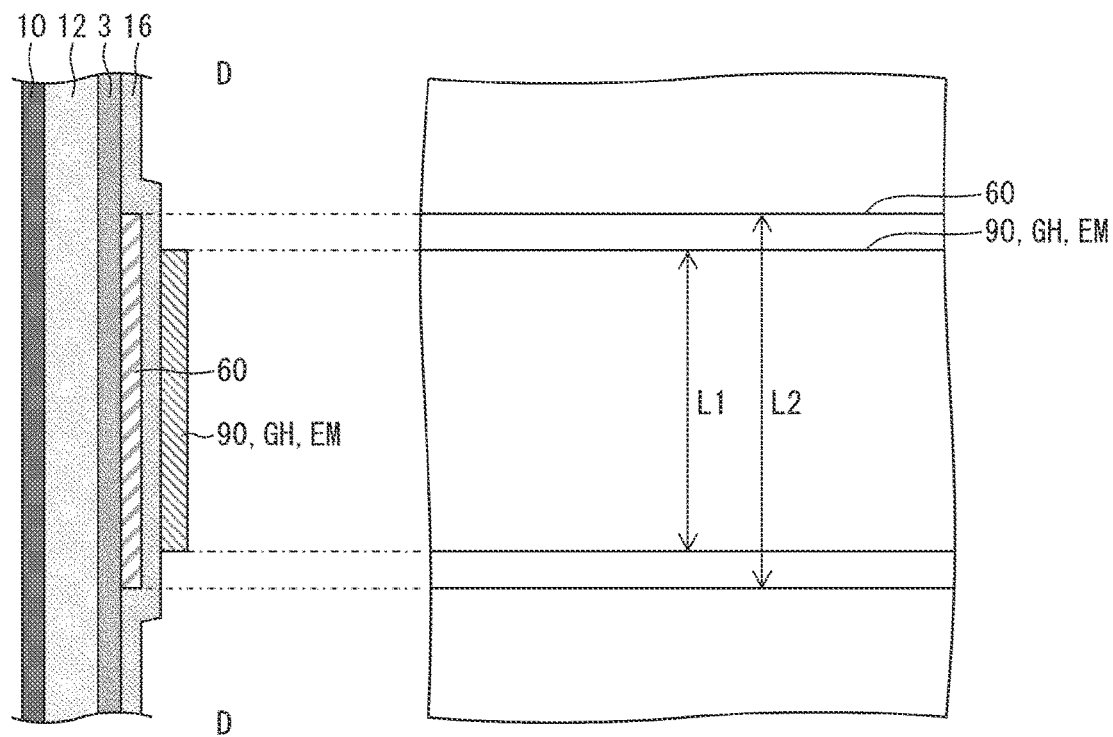
FIG. 8 is a schematic cross-sectional view and a schematic plan view of an exemplary overlap of an insular semiconductor layer on parts of the control lines shown in FIGS. 6 and 7.

FIG. 8 is a schematic cross-sectional view and a schematic plan view of an exemplary overlap of the insular semiconductor layer 60 on parts of the control lines 90 shown in FIGS. 6 and 7. The schematic cross-sectional view of FIG. 8 shows a cross-section taken in the column direction, for example, a cross-section taken along line D-D in FIG. 6.

The insular semiconductor layer 60 in FIG. 8 has a width L2 that is larger than a width L1 of a part of the control line 90 (L2>L1). The width L2 of the insular semiconductor layer 60 and the width L1 of the control line 90 are dimensions thereof measured in the column direction. Therefore, the insular semiconductor layer 60 overlaps the column-direction ends and central portion of the control line 90 in a plan view.

Figure 9:
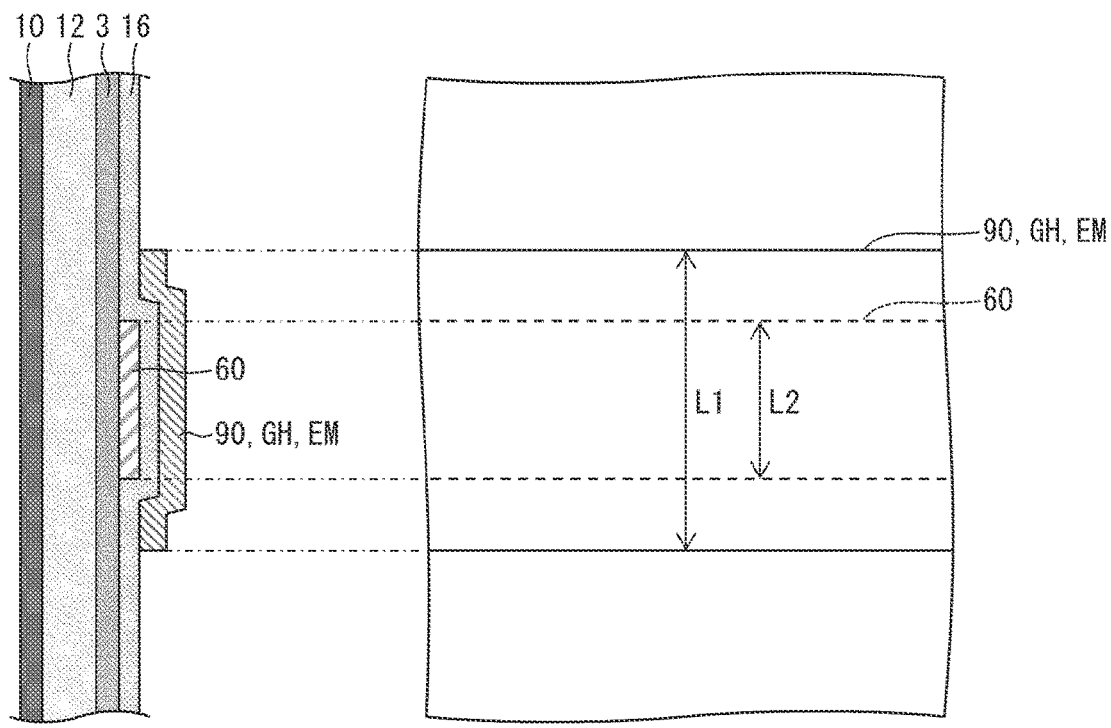
FIG. 9 is a schematic cross-sectional view and a schematic plan view of another exemplary overlap of the insular semiconductor layer on the parts of the control lines shown in FIGS. 6 and 7.

FIG. 9 is a schematic cross-sectional view and a schematic plan view of another exemplary overlap of the insular semiconductor layers 60 on the parts of the control lines 90. The schematic cross-sectional view of FIG. 9 is also a cross-section taken in the column direction.

The width L2 of the insular semiconductor layer 60 in FIG. 9 is smaller than the width L1 of the control line 90 (L2<L1). Therefore, the insular semiconductor layer 60 overlaps the column-wise central portion of the control line 90 in a plan view, but does not overlap the column-direction ends of the control line 90 in a plan view. The structure shown in FIG. 9 therefore creates a smaller parasitic capacitance between the insular semiconductor layer 60 and the control line 90 than does the structure shown in FIG. 8.

The insular semiconductor layer 60 shown in FIG. 9 prevents the occurrence and growth of cracks in the inorganic insulation film 16 below the central portion of the control line 90, thereby preventing breaks in the control line 90. The structure shown in FIG. 9 can therefore reduce the parasitic capacitance caused by the insular semiconductor layer 60 over the structure shown in FIG. 8 and can prevent breaks in the control line 90 that might otherwise be caused by cracks in the inorganic insulation film 16, similarly to the structure shown in FIG. 8.

Figure 10:
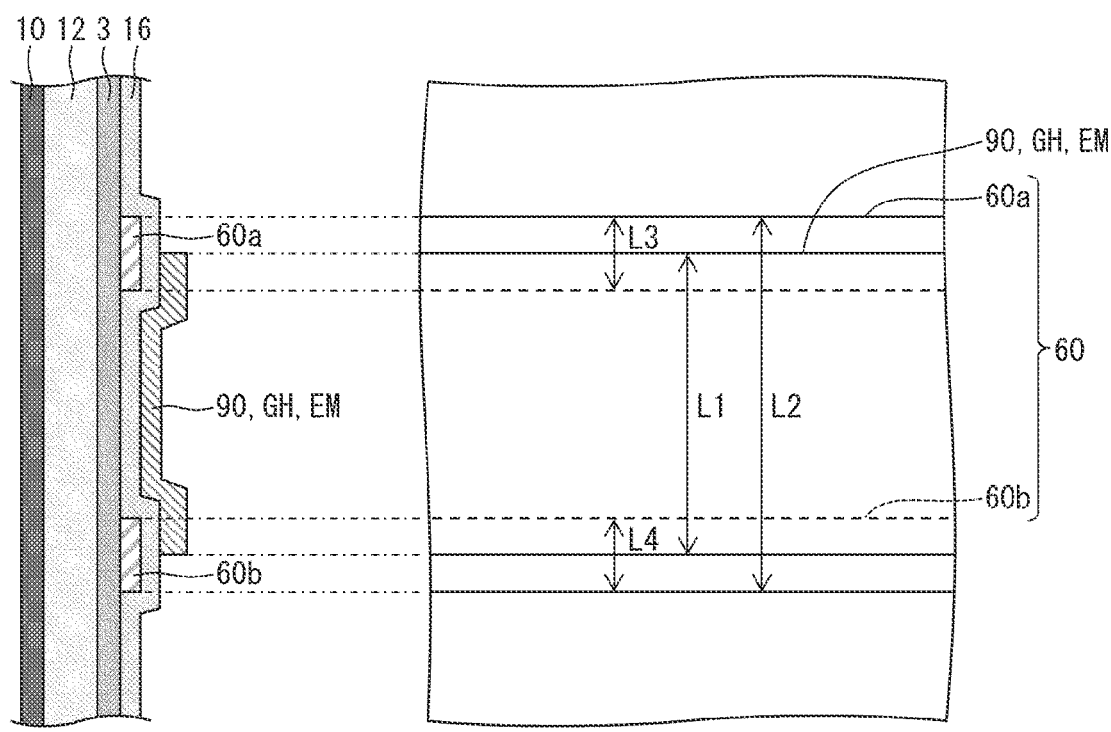
FIG. 10 is a schematic cross-sectional view and a schematic plan view of yet another exemplary overlap of the insular semiconductor layer on the parts of the control lines shown in FIGS. 6 and 7.

FIG. 10 is a schematic cross-sectional view and a schematic plan view of yet another exemplary overlap of the insular semiconductor layers 60 on the parts of the control lines 90. The schematic cross-sectional view of FIG. 10 is also a cross-section taken in the column direction.

The insular semiconductor layer 60 in FIG. 10 includes a pair of insular semiconductor layers 60a and 60b separated in the column direction from each other by a gap. The width L2 of the whole insular semiconductor layer 60 is larger than the width L1 of the control line 90 (L2>L1), and the insular semiconductor layer 60a, which is one of the insular semiconductor layers 60, and the insular semiconductor layer 60b, which is the other one of the insular semiconductor layers 60, have respective widths L3 has L4 that are both smaller than the width L1 of the control line 90 (L3<L1, L4<L1). Therefore, in a plan view, the insular semiconductor layer 60a, which is one of the insular semiconductor layers 60, overlaps one of the column-direction ends of the control line 90 (the top in FIG. 10), and the insular semiconductor layer 60b, which is the other one of the insular semiconductor layers 60, overlaps the other column-direction end of the control line 90 that is opposite that one of the column-direction ends (the bottom in FIG. 10). The whole insular semiconductor layer 60 overlaps both the column-direction ends of the control line 90 in a plan view, but does not overlap the column-wise central portion of the control line 90 in a plan view. Therefore, the parasitic capacitance produced between the insular semiconductor layer 60 and the control line 90 is smaller in the structure shown in FIG. 10 than in the structure shown in FIG. 8.

The insular semiconductor layer 60 shown in FIG. 10 prevents the occurrence and growth of cracks in the inorganic insulation film 16 under the both ends of the control line 90, thereby preventing breaks in the control line 90. The structure shown in FIG. 10 can therefore reduce the parasitic capacitance caused by the insular semiconductor layer 60 over the structure shown in FIG. 8 and can prevent breaks in the control line 90 that might otherwise be caused by cracks in the inorganic insulation film 16, similarly to the structure shown in FIG. 8.

The display device 2 in accordance with present Embodiment 1, when including the insular semiconductor layers 60 of any of the structures in FIGS. 8 to 10, has a lower probability of causing and developing cracks in the inorganic insulation film 16 and hence a lower rate of breaks in the control line 90, thereby achieving a higher manufacturing yield, than the comparative example in FIG. 4.

Formation of Insular Semiconductor Layer

Figure 11:
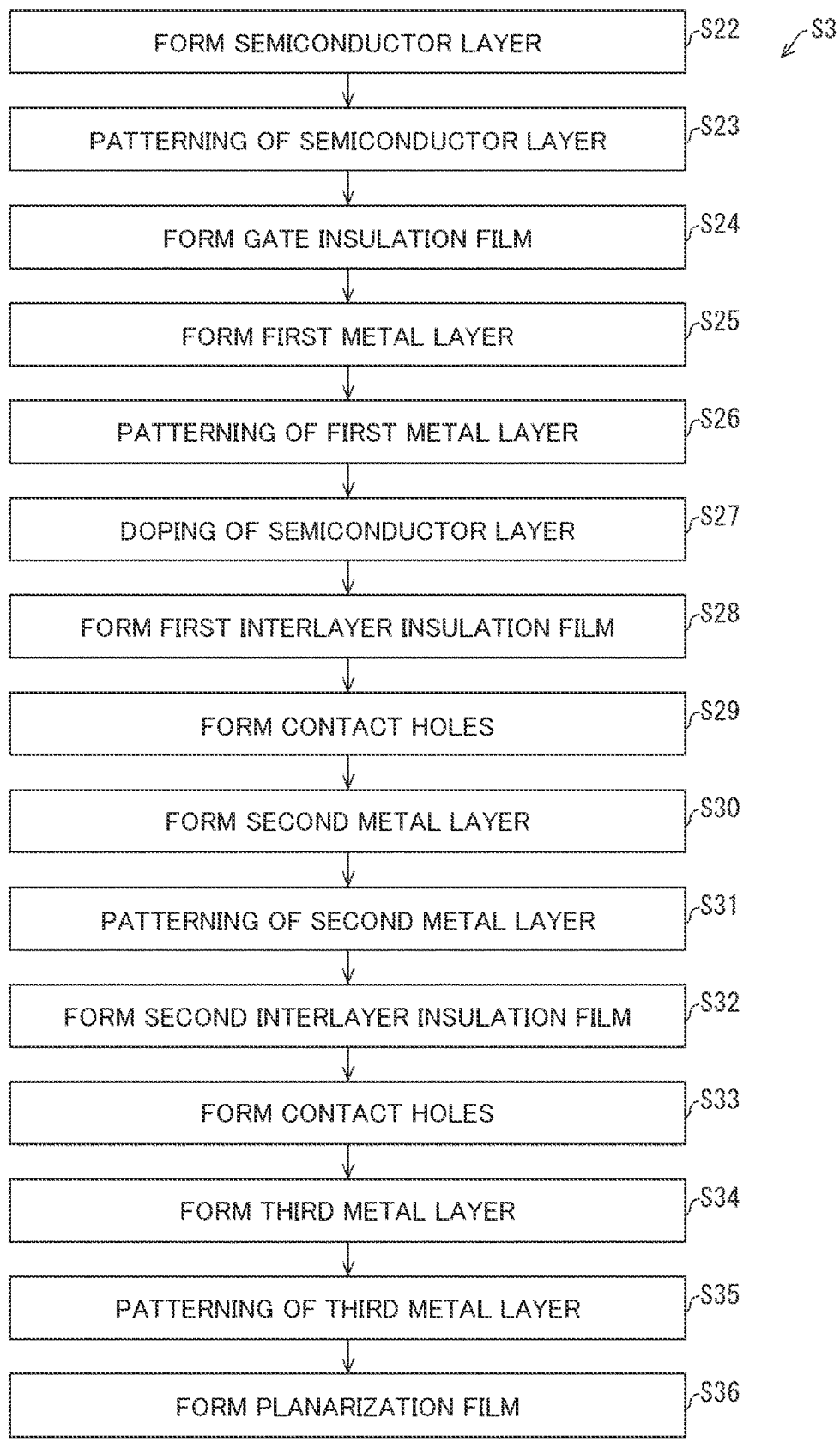
FIG. 11 is a flow chart representing an exemplary step of forming a thin film transistor layer.

FIG. 11 is a flow chart representing exemplary step S3 of forming the thin film transistor layer 4.

Referring to FIG. 11, subsequent to step S2 of forming the barrier layer 3, a semiconductor layer is formed of the same material as the semiconductor film 15 (step S22), and the semiconductor layer is patterned into the formation pattern of the connecting semiconductor layers 50 and the insular semiconductor layers 60 by, for example, photolithography and etching (step S23). The inorganic insulation film 16 is then formed as a gate insulation film (step S24). The connecting semiconductor layers 50 and the insular semiconductor layers 60 prevent the occurrence and growth of cracks over each inorganic insulation film 16 in step S24.

Subsequently, a first metal layer is formed (step S25), and the first metal layer is patterned into the formation pattern of the gate electrodes GE and the control lines 90 such as the gate lines GH and the light-emission control lines EM by, for example, photolithography and etching (step S26).

The connecting semiconductor layers 50 and the insular semiconductor layers 60 are then doped with impurity ions by using the gate electrodes GE and the control lines 90 as a mask. This doping leaves the portion 15a, which is a portion of the connecting semiconductor layers 50 that intersects with, and is buried under, the gate electrodes GE or the control lines 90, undoped so as to serve as a semiconductor. The portion 15a hence functions as the channel region for the first thin film transistor T1 to the seventh thin film transistor T7. At the same time, the remaining portions 15b of the connecting semiconductor layers 50 are doped, changing the nature thereof so as to function as a good conductor (i.e., turning into a conductor). The portions 15b hence function as the drain terminal, the source terminal, and wiring for the first thin film transistor T1 to the seventh thin film transistor T7.

Subsequently, the inorganic insulation film 18 is formed as a first interlayer insulation film (step S28), contact holes are formed in the inorganic insulation film 18 (step S29), and a second metal layer is formed (step S30). The second metal layer is then patterned into the formation pattern of, for example, the capacitor electrodes CE, the capacitor lines CS, and the initialization-potential lines Vini by, for example, photolithography and etching (step S31).

Subsequently, the inorganic insulation film 20 is formed as a second interlayer insulation film (step S32), contact holes are formed in the inorganic insulation film 20 (step S33), and a third metal layer is formed (step S34). The third metal layer is then patterned into the formation pattern of, for example, the source lines SH and the high potential lines ELVdd by, for example, photolithography and etching (step S35).

Finally, the planarization film 21 is formed (step S36). The process continues to step S4 where the light-emitting element layer 5 is formed.

Embodiment 2

The following will describe other embodiments of the disclosure. For convenience of description, members of the present embodiment that have the same function as members of the preceding embodiment are indicated by the same or similar reference numerals, and description thereof is not repeated.

Figure 12:
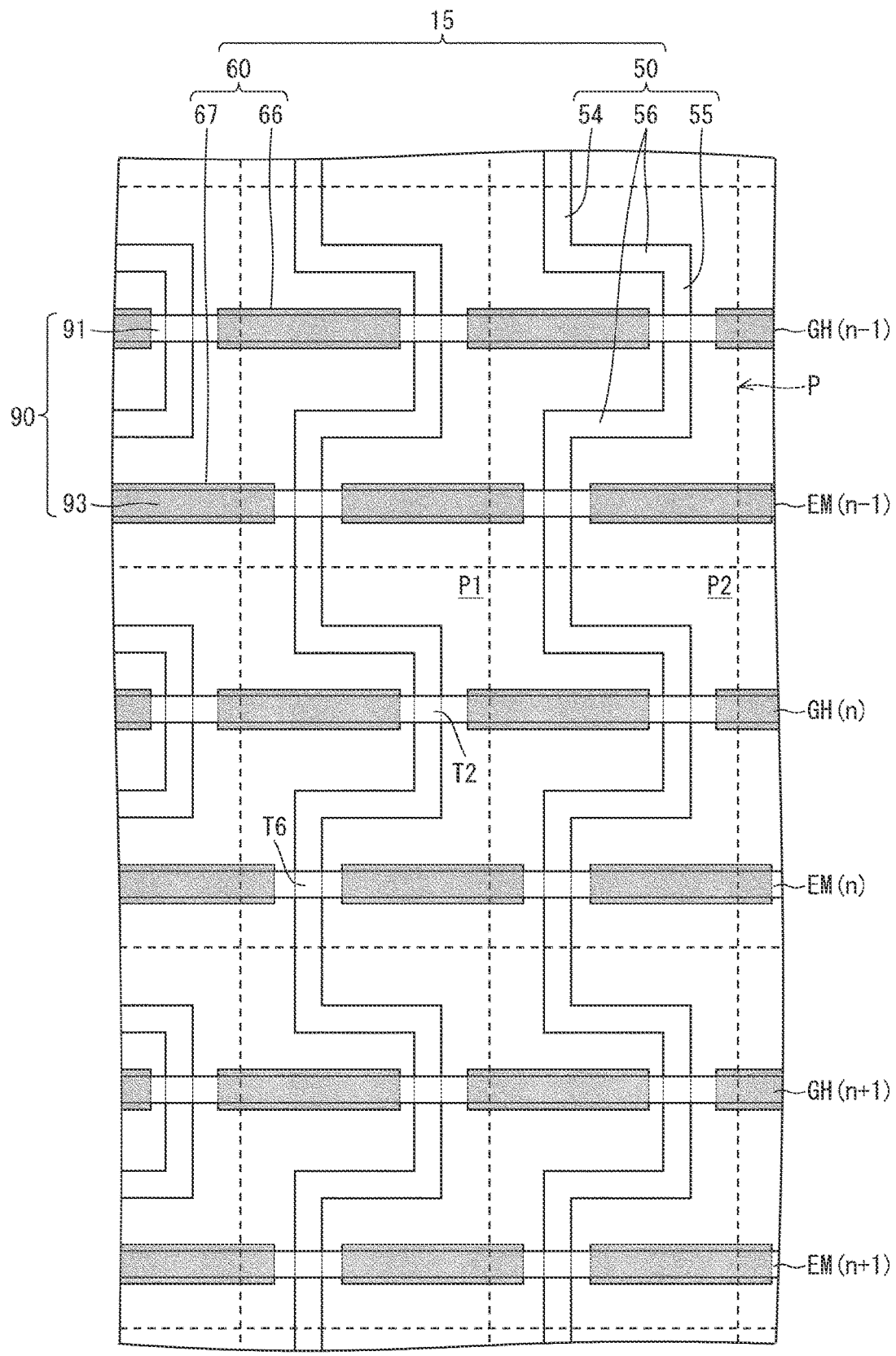
FIG. 12 is a schematic plan view of an exemplary formation pattern of a semiconductor film and an exemplary formation pattern of control lines in accordance with Embodiment 2 of the disclosure.
Figure 13:
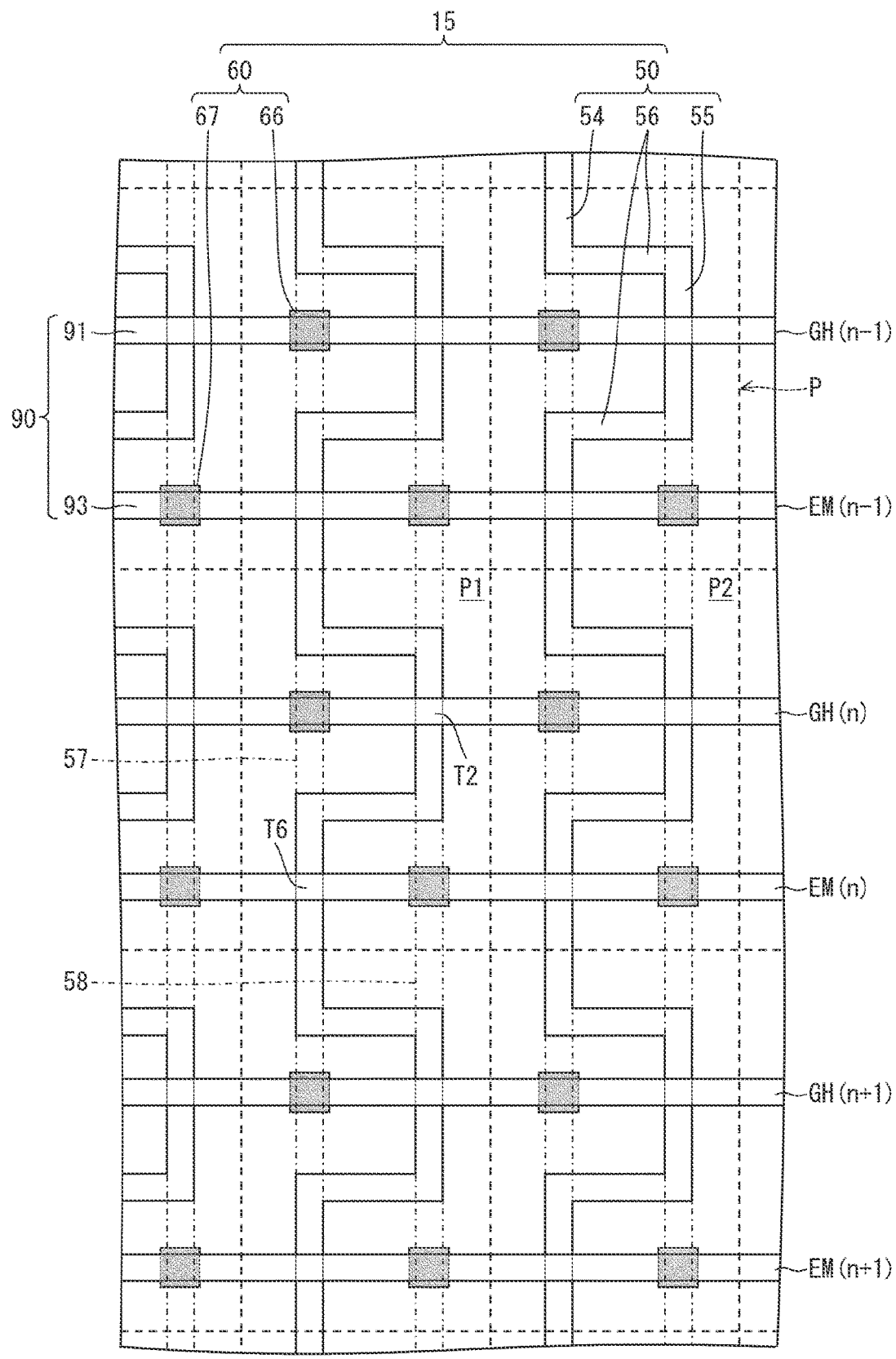
FIG. 13 is a schematic plan view of another exemplary formation pattern of the semiconductor film and another exemplary formation pattern of the control lines in accordance with Embodiment 2 of the disclosure.

FIG. 12 is a schematic plan view of an exemplary formation pattern of the semiconductor film 15 and an exemplary formation pattern of the control lines 90 in accordance with present Embodiment 2. FIG. 13 is a schematic plan view of another exemplary formation pattern of the semiconductor film 15 and another exemplary formation pattern of the control lines 90 in accordance with present Embodiment 2. The insular semiconductor layers 60 are hatched in FIGS. 12 and 13 for better understanding of the disclosure.

The straight-line portions of the formation pattern of Embodiment 1 above shown in FIGS. 6 and 7 may wobble. FIGS. 12 and 13 are plan views primarily of select elements related to the second thin film transistor T2 and the sixth thin film transistor T6 and additionally of other various elements in a simplified form, to illustrate an exemplary structure in accordance with the disclosure in a case where a plurality of connecting semiconductor layers 50 wobbles or has wobbling portions.

A display device 2 in accordance with present Embodiment 2 includes a plurality of sets of control lines 90 extending in the column direction, a plurality of data signal lines (not shown) extending in the row direction, and the connecting semiconductor layers 50 extending generally in the column direction, as shown in FIGS. 12 and 13.

Throughout the following description, the subpixel P of interest will be referred to as the first subpixel P1, and the subpixel P adjacent to the first subpixel P1 on a row-direction side of the first subpixel P1 (the right side in FIGS. 12 and 13) will be referred to as the second subpixel P2.

Each connecting semiconductor layer 50 includes a plurality of first connecting semiconductor layers 54, a plurality of second connecting semiconductor layers 55, and a plurality of third connecting semiconductor layers 56.

The first connecting semiconductor layers 54 in one connecting semiconductor layer 50 extend in the column direction (in the up/down direction in FIGS. 12 and 13) and are aligned and separated from each other in the column direction. The second connecting semiconductor layers 55 in one connecting semiconductor layer 50 extend in the column direction and are aligned and separated from each other in the column direction. These second connecting semiconductor layers 55 are offset in the column direction from the associated, first connecting semiconductor layers 54 and provided on a row-direction (the left and right direction in FIGS. 12 and 13) side (on the right side in FIGS. 12 and 13) of the associated, first connecting semiconductor layers 54. Each third connecting semiconductor layer 56 extends in the row direction and either connects a column-direction end (lower end) of the associated, second connecting semiconductor layer 55 to the other column-direction end (upper end) of the associated, first connecting semiconductor layer 54 or connects a column-direction end (upper end) of the associated, second connecting semiconductor layer 55 to the other column-direction end (lower end) of the associated, first connecting semiconductor layer 54. Accordingly, the connecting semiconductor layer 50 in accordance with present Embodiment 2 is provided wobbling through a column of subpixels P.

Each first connecting semiconductor layer 54 does not intersect with the first control line 91, but intersects with the third control line 93, forming the sixth thin film transistor T6 at the intersection thereof with the third control line 93. Each second connecting semiconductor layer 55 does not intersect with the third control line 93, but intersects with the first control line 91, forming the second thin film transistor T2 at the intersection thereof with the first control line 91.

Each insular semiconductor layer 60 in accordance with present Embodiment 2 includes: a sixth insular semiconductor layer 66 overlapping a portion of the first control line 91; and a seventh insular semiconductor layer 67 overlapping a portion of the third control line 93.

Sixth Insular Semiconductor Layer

The sixth insular semiconductor layer 66 is provided overlapping a portion of the first control line 91 between the second connecting semiconductor layer 55 in the first subpixel P1 and the second connecting semiconductor layer 55 in the second subpixel P2 as shown in FIG. 12. In other words, the sixth insular semiconductor layer 66 is provided between the second thin film transistor T2 in the first subpixel P1 and the second thin film transistor T2 in a second subpixel P2 so as to overlap a portion of the first control line 91. It would be understood from a comparison of FIGS. 6 and 12 that the sixth insular semiconductor layer 66 in FIG. 12 corresponds to the second insular semiconductor layer 62 and the third insular semiconductor layer 63 in FIG. 6.

FIG. 12 shows a structure in which the sixth insular semiconductor layer 66 is provided overlapping the largest possible area of those portions of the first control line 91 under which there is provided no connecting semiconductor layer 50. The sixth insular semiconductor layer 66 causes a large parasitic capacitance in this structure. The structure can however reliably prevent the occurrence and growth of cracks in the inorganic insulation film 16, thereby reliably preventing crack-caused breaks in the first control line 91. In addition, the structure shown in FIG. 12 includes the insular semiconductor layers 60 sitting next to each other and extending in the column direction. The stack of the support substrate, the resin layer 12, and the barrier layer 3 will therefore more unlikely bend in the column direction than in a known structure in which there is provided no insular semiconductor layer. The structure shown in FIG. 12 hence restrains bending, and the inorganic insulation film 16 will therefore unlikely develop cracks.

Alternatively, the sixth insular semiconductor layer 66 may be provided only overlapping a first intersection of the first control line 91 and a first imaginary line 57 connecting those two first connecting semiconductor layers 54 which are adjacent to each other in the column direction as shown in FIG. 13. The structure shown in FIG. 13 can therefore reduce the parasitic capacitance caused by the sixth insular semiconductor layer 66 over the structure shown in FIG. 12 and prevent the occurrence and growth of cracks in the inorganic insulation film 16 with a high degree of certainty, thereby preventing breaks in the control lines 90 caused by cracks in the inorganic insulation film 16 with a high degree of certainty. This is based on the aforementioned finding made by the inventors that cracks tend to form and grow within the first imaginary line 57 and the second imaginary line 58 (described later in detail). The profiles of the first imaginary line 57 and the second imaginary line 58 (described later in detail) are partially drawn by a dash-dot line in FIG. 13.

Alternatively, the sixth insular semiconductor layer 66 may have a structure that is intermediate between FIGS. 12 and 13.

Seventh Insular Semiconductor Layer 67

The seventh insular semiconductor layer 67 is provided overlapping a portion of the third control line 93 between the first connecting semiconductor layer 54 in the first subpixel P1 and the first connecting semiconductor layer 54 in the second subpixel P2 as shown in FIG. 12. In other words, the seventh insular semiconductor layer 67 is provided between the sixth thin film transistor T6 in the first subpixel P1 and the sixth thin film transistor T6 in the second subpixel P2 so as to overlap a portion of the third control line 93. It would be understood from a comparison of FIGS. 6 and 12 that the seventh insular semiconductor layer 67 in FIG. 12 corresponds to the fourth insular semiconductor layer 64 and the fifth insular semiconductor layer 65 in FIG. 6.

The seventh insular semiconductor layer 67, similarly to the sixth insular semiconductor layer 66, may be provided overlapping the largest possible area of those portions of the third control line 93 under which there is provided no connecting semiconductor layer 50 as shown in FIG. 12 or may be provided only overlapping a second intersection of the third control line 93 and the second imaginary line 58 connecting those two second connecting semiconductor layers 55 which are adjacent to each other in the column direction as shown in FIG. 13. As a further alternative, the seventh insular semiconductor layer 67 may have a structure that is intermediate between FIGS. 12 and 13.

General Description

The disclosure, in aspect 1 thereof, is directed to a display device including a substrate, a semiconductor layer, a gate insulation film, first wiring, a first interlayer insulation film, and second wiring, all of which are provided in a stated order, the display device having a display area and a frame area around the display area, the display device further including in the display area: a plurality of control lines, which is a part of the first wiring, extending in a row direction; a plurality of data signal lines, which is a part of the second wiring, extending in a column direction that differs from the row direction; a plurality of subpixels, one for each intersection of the plurality of control lines and the plurality of data signal lines; a plurality of light-emitting elements, one for each one of the plurality of subpixels; and an insular semiconductor layer in the semiconductor layer, the insular semiconductor layer being electrically separated from the plurality of control lines and the plurality of data signal lines and being provided overlapping one of the plurality of control lines in a plan view taken normal to the substrate.

In aspect 2 of the disclosure, the display device of aspect 1 may be configured such that the plurality of subpixels is arranged to form a plurality of columns of subpixels, the semiconductor layer includes a plurality of connecting semiconductor layers electrically separated from the insular semiconductor layer, and each one of the plurality of connecting semiconductor layers forms a plurality of thin film transistors and is provided for those of the plurality of subpixels which are in one of the plurality of columns of subpixels.

In aspect 3 of the disclosure, the display device of aspect 2 may be configured such that the insular semiconductor layer is provided overlapping a portion of the one of the plurality of control lines between those two of the plurality of connecting semiconductor layers which are adjacent to each other in the row direction in the plan view.

In aspect 4 of the disclosure, the display device of aspect 2 may be configured such that each one of the plurality of connecting semiconductor layers includes: a plurality of first connecting semiconductor layers; and a plurality of second connecting semiconductor layers on a row-direction side of the plurality of first connecting semiconductor layers.

In aspect 5 of the disclosure, the display device of aspect 4 may be configured such that the insular semiconductor layer is provided overlapping a first intersection of the one of the plurality of control lines at which the one of the plurality of control lines intersects with a first imaginary line connecting those two of the plurality of first connecting semiconductor layers which are adjacent to each other in the column direction in the plan view.

In aspect 6 of the disclosure, the display device of aspect 4 may be configured such that the insular semiconductor layer is provided overlapping a second intersection of the one of the plurality of control lines at which the one of the plurality of control lines intersects with a second imaginary line connecting those two of the plurality of second connecting semiconductor layers which are adjacent to each other in the column direction in the plan view.

In aspect 7 of the disclosure, the display device of aspect 2 may be configured such that the plurality of control lines includes a plurality of scan control lines and a plurality of light-emission control lines, each one of the plurality of connecting semiconductor layers includes: a first connecting semiconductor layer for those of the plurality of subpixels which are in one of the plurality of columns of subpixels that is associated with the one of the plurality of connecting semiconductor layers, the first connecting semiconductor layer intersecting with the plurality of scan control lines and the plurality of light-emission control lines; a plurality of second connecting semiconductor layers for each one of the plurality of subpixels that is in one of the plurality of columns of subpixels that is associated with the one of the plurality of connecting semiconductor layers, the plurality of second connecting semiconductor layers being provided on a row-direction side of an associated one of the first connecting semiconductor layers and intersecting with an associated one of the plurality of scan control lines and an associated one of the plurality of light-emission control lines; and a plurality of third connecting semiconductor layers for each one of the plurality of subpixels that is in one of the plurality of columns of subpixels that is associated with the one of the plurality of connecting semiconductor layers, the plurality of third connecting semiconductor layers connecting those of the plurality of second connecting semiconductor layers which are associated with the first connecting semiconductor layers, wherein the first wiring includes a gate electrode of one of the plurality of thin film transistors, and the plurality of third connecting semiconductor layers includes a channel region opposite the gate electrode.

In aspect 8 of the disclosure, the display device of aspect 7 may be configured such that the insular semiconductor layer is provided overlapping a portion of one of the plurality of scan control lines between (i) one of the first connecting semiconductor layers in one of the plurality of connecting semiconductor layers and (ii) one of the plurality of second connecting semiconductor layers in this one of the plurality of connecting semiconductor layers in the plan view.

In aspect 9 of the disclosure, the display device of aspect 7 may be configured such that the insular semiconductor layer, corresponding to one of the plurality of scan control lines, is provided overlapping a portion of one of the plurality of scan control lines between (i) one of the plurality of second connecting semiconductor layers in a first one of the plurality of connecting semiconductor layers and (ii) one of the first connecting semiconductor layers in a second one of the plurality of connecting semiconductor layers that is adjacent to the first one of the plurality of connecting semiconductor layers on the row-direction side of the first one of the plurality of connecting semiconductor layers in the plan view.

In aspect 10 of the disclosure, the display device of aspect 7 may be configured such that the insular semiconductor layer is provided overlapping a portion of one of the plurality of light-emission control lines between (i) one of the first connecting semiconductor layers in one of the plurality of connecting semiconductor layers and (ii) one of the plurality of second connecting semiconductor layers in this one of the plurality of connecting semiconductor layers in the plan view.

In aspect 11 of the disclosure, the display device of aspect 7 may be configured such that the insular semiconductor layer is provided overlapping a portion of one of the plurality of light-emission control lines between (i) one of the plurality of second connecting semiconductor layers in a first one of the plurality of connecting semiconductor layers and (ii) one the first connecting semiconductor layers in in a second one of the plurality of connecting semiconductor layers that is adjacent to the first one of the plurality of connecting semiconductor layers on the row-direction side of the first one of the plurality of connecting semiconductor layers in the plan view.

In aspect 12 of the disclosure, the display device of aspect 7 may be configured such that the plurality of control lines further includes a plurality of scan control lines to which a scan signal for a preceding stage is fed, and the insular semiconductor layer is provided overlapping a portion of one of the plurality of scan control lines to which a scan signal for a preceding stage is fed between (i) one of the first connecting semiconductor layers in a first one of the plurality of connecting semiconductor layers and (ii) another one of the first connecting semiconductor layers in a second one of the plurality of connecting semiconductor layers that is adjacent to the first one of the plurality of connecting semiconductor layers on the row-direction side of the first one of the plurality of connecting semiconductor layers in the plan view.

In aspect 13 of the disclosure, the display device of aspect 7 may be configured such that the insular semiconductor layer is provided overlapping a second intersection of the one of the plurality of control lines at which the one of the plurality of control lines intersects with a second imaginary line connecting those two of the plurality of second connecting semiconductor layers which are adjacent to each other in the column direction in the plan view.

In aspect 14 of the disclosure, the display device of aspect 1 may be configured such that the insular semiconductor layer includes a pair of insular semiconductor layers separated from each other in the column direction, one of the pair of insular semiconductor layers overlaps a column-direction end of the one of the plurality of control lines, and another one of the pair of insular semiconductor layers overlaps another column-direction end of the one of the plurality of control lines opposite the column-direction end.

In aspect 15 of the disclosure, the display device of aspect 1 may be configured such that the insular semiconductor layer has a larger width than does the one of the plurality of control lines.

In aspect 16 of the disclosure, the display device of aspect 1 may be configured such that the insular semiconductor layer has a smaller width than does the one of the plurality of control lines.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A display device comprising a substrate, a semiconductor layer, a gate insulation film, first wiring, an interlayer insulation film, and second wiring, all of which are provided in a stated order,
the display device having a display area and a frame area around the display area,
the display device further comprising, in the display area:
a plurality of control lines, which is a part of the first wiring, extending in a row direction;
a plurality of data signal lines, which is a part of the second wiring, extending in a column direction that differs from the row direction;
a plurality of subpixels, one for each intersection of the plurality of control lines and the plurality of data signal lines;
a plurality of light-emitting elements, one for each one of the plurality of subpixels; and
an insular semiconductor layer in the semiconductor layer, the insular semiconductor layer being electrically separated from the plurality of control lines and the plurality of data signal lines, and overlapping one of the plurality of control lines in a plan view taken normal to the substrate, wherein
the plurality of subpixels is arranged to form a plurality of columns of subpixels,
the semiconductor layer includes a plurality of connecting semiconductor layers electrically separated from the insular semiconductor layer, and
each one of the plurality of connecting semiconductor layers forms a plurality of thin film transistors and is provided for subpixels, among the plurality of subpixels, that are in one of the plurality of columns of subpixels.

2. The display device according to claim 1, wherein the insular semiconductor layer overlaps a portion of the one of the plurality of control lines between two connecting semiconductor layers, among the plurality of connecting semiconductor layers, that are adjacent to each other in the row direction in the plan view.

3. The display device according to claim 1, wherein each one of the plurality of connecting semiconductor layers includes:
a plurality of first connecting semiconductor layers; and
a plurality of second connecting semiconductor layers on a row-direction side of the plurality of first connecting semiconductor layers.

4. The display device according to claim 3, wherein the insular semiconductor layer further overlaps a first intersection of the one of the plurality of control lines at which the one of the plurality of control lines intersects with a first imaginary line connecting two first connecting semiconductor layers, among the plurality of first connecting semiconductor layers, that are adjacent to each other in the column direction in the plan view.

5. The display device according to claim 3, wherein the insular semiconductor layer further overlaps a second intersection of the one of the plurality of control lines at which the one of the plurality of control lines intersects with a second imaginary line connecting two second connecting semiconductor layers, among the plurality of second connecting semiconductor layers, that are adjacent to each other in the column direction in the plan view.

6. The display device according to claim 1, wherein
the plurality of control lines includes a plurality of scan control lines and a plurality of light-emission control lines,
each one of the plurality of connecting semiconductor layers includes:
a first connecting semiconductor layer for subpixels, among the plurality of subpixels, that are in one of the plurality of columns of subpixels that is associated with the one of the plurality of connecting semiconductor layers, the first connecting semiconductor layer intersecting with the plurality of scan control lines and the plurality of light-emission control lines;
a plurality of second connecting semiconductor layers for each one of the plurality of subpixels that is in one of the plurality of columns of subpixels that is associated with the one of the plurality of connecting semiconductor layers, the plurality of second connecting semiconductor layers being provided on a row-direction side of an associated one of a plurality of first connecting semiconductor layers, including the first connecting semiconductor layer, and intersecting with an associated one of the plurality of scan control lines and an associated one of the plurality of light-emission control lines; and
a plurality of third connecting semiconductor layers for each one of the plurality of subpixels that is in one of the plurality of columns of subpixels that is associated with the one of the plurality of connecting semiconductor layers, the plurality of third connecting semiconductor layers connecting second connecting semiconductor layers, among the plurality of second connecting semiconductor layers, that are associated with the plurality of first connecting semiconductor layers, wherein
the first wiring includes a gate electrode of one of the plurality of thin film transistors, and
the plurality of third connecting semiconductor layers includes a channel region opposite the gate electrode.

7. The display device according to claim 6, wherein the insular semiconductor layer further overlaps a portion of one of the plurality of scan control lines between (i) one of the plurality of first connecting semiconductor layers in one of the plurality of connecting semiconductor layers and (ii) one of the plurality of second connecting semiconductor layers in the one of the plurality of connecting semiconductor layers in the plan view.

8. The display device according to claim 6, wherein the insular semiconductor layer further overlaps a portion of one of the plurality of scan control lines between (i) one of the plurality of second connecting semiconductor layers in a first one of the plurality of connecting semiconductor layers and (ii) one of the plurality of first connecting semiconductor layers in a second one of the plurality of connecting semiconductor layers that is adjacent to the first one of the plurality of connecting semiconductor layers on the row-direction side of the first one of the plurality of connecting semiconductor layers in the plan view.

9. The display device according to claim 6, wherein the insular semiconductor layer further overlaps a portion of one of the plurality of light-emission control lines between (i) one of the plurality of first connecting semiconductor layers in one of the plurality of connecting semiconductor layers and (ii) one of the plurality of second connecting semiconductor layers in the this one of the plurality of connecting semiconductor layers in the plan view.

10. The display device according to claim 6, wherein the insular semiconductor layer further overlaps a portion of one of the plurality of light-emission control lines between (i) one of the plurality of second connecting semiconductor layers in a first one of the plurality of connecting semiconductor layers and (ii) one of the plurality of first connecting semiconductor layers in a second one of the plurality of connecting semiconductor layers that is adjacent to the first one of the plurality of connecting semiconductor layers on the row-direction side of the first one of the plurality of connecting semiconductor layers in the plan view.

11. The display device according to claim 6, wherein
the plurality of control lines further includes a plurality of scan control lines to which a scan signal for a preceding stage is fed, and
the insular semiconductor layer further overlaps a portion of one of the plurality of scan control lines to which the scan signal for the preceding stage is fed between (i) one of the plurality of first connecting semiconductor layers in a first one of the plurality of connecting semiconductor layers and (ii) another one of the plurality of first connecting semiconductor layers in a second one of the plurality of connecting semiconductor layers that is adjacent to the first one of the plurality of connecting semiconductor layers on the row-direction side of the first one of the plurality of connecting semiconductor layers in the plan view.

12. The display device according to claim 6, wherein the insular semiconductor layer further overlaps a second intersection of the one of the plurality of control lines at which the one of the plurality of control lines intersects with a second imaginary line connecting two second connecting semiconductor layers, among the plurality of second connecting semiconductor layers, that are adjacent to each other in the column direction in the plan view.

13. A display device comprising a substrate, a semiconductor layer, a gate insulation film, first wiring, an interlayer insulation film, and second wiring, all of which are provided in a stated order,
the display device having a display area and a frame area around the display area,
the display device further comprising, in the display area:
a plurality of control lines, which is a part of the first wiring, extending in a row direction;
a plurality of data signal lines, which is a part of the second wiring, extending in a column direction that differs from the row direction;
a plurality of subpixels, one for each intersection of the plurality of control lines and the plurality of data signal lines;
a plurality of light-emitting elements, one for each one of the plurality of subpixels; and
an insular semiconductor layer in the semiconductor layer, the insular semiconductor layer being electrically separated from the plurality of control lines and the plurality of data signal lines, and overlapping one of the plurality of control lines in a plan view taken normal to the substrate, wherein the insular semiconductor layer has a width smaller than a width of the one of the plurality of control lines.

* * * * *